US007982369B2

(12) United States Patent
Ona et al.

(10) Patent No.: US 7,982,369 B2

(45) Date of Patent: Jul. 19, 2011

(54) ULTRASONIC PROBE AND ULTRASONIC DIAGNOSTIC APPARATUS

(75) Inventors: Yasuhiro Ona, Nasushiobara (JP); Koichi Shibamoto, Nasushiobara (JP)

(73) Assignees: Kabushiki Kaisha Toshiba, Tokyo (JP); Toshiba Medical Systems Corporation, Otawara-shi (JP)

( * ) Notice: Subject to any disclaimer, the term of this patent is extended or adjusted under 35 U.S.C. 154(b) by 270 days.

(21) Appl. No.: 12/365,429

(22) Filed: Feb. 4, 2009

(65) Prior Publication Data

US 2009/0204001 A1 Aug. 13, 2009

(30) Foreign Application Priority Data

Feb. 8, 2008 (JP) ................................ 2008-029688
Jan. 29, 2009 (JP) ................................ 2009-017535

(51) Int. Cl.
*H01L 41/08* (2006.01)
*H04R 19/00* (2006.01)

(52) U.S. Cl. ........ 310/334; 367/181; 367/153; 367/174; 381/174; 381/191

(58) Field of Classification Search .................. 310/322, 310/334; 367/153, 174, 181; 381/174, 191
See application file for complete search history.

(56) References Cited

U.S. PATENT DOCUMENTS

| | | | | |
|---|---|---|---|---|
| 6,262,946 | B1 * | 7/2001 | Khuri-Yakub et al. | 367/181 |
| 6,504,289 | B2 * | 1/2003 | Toda et al. | 310/334 |
| 6,945,115 | B1 * | 9/2005 | Wang | 73/718 |
| 7,285,897 | B2 | 10/2007 | Fisher et al. | |
| 7,332,850 | B2 | 2/2008 | Ladabaum et al. | |
| 7,493,821 | B2 * | 2/2009 | Wang | 73/718 |
| 2005/0146247 | A1 * | 7/2005 | Fisher et al. | 310/334 |
| 2005/0200241 | A1 * | 9/2005 | Degertekin | 310/334 |
| 2007/0013264 | A1 | 1/2007 | Wilser et al. | |
| 2007/0013269 | A1 | 1/2007 | Huang | |
| 2007/0264732 | A1 * | 11/2007 | Chen | 438/22 |
| 2008/0259725 | A1 * | 10/2008 | Bayram et al. | 367/7 |

FOREIGN PATENT DOCUMENTS

JP 2005-210710 8/2005

* cited by examiner

*Primary Examiner* — Thomas M Dougherty

(74) *Attorney, Agent, or Firm* — Oblon, Spivak, McClelland, Maier & Neustadt, L.L.P.

(57) ABSTRACT

A base has a plurality of projections or recesses. Each of the projections or recesses corresponds to one channel of vibration elements. Each of the vibration elements has a plurality of MUT elements. Each of the MUT elements transmits and receives ultrasonic waves. A plurality of MUT elements are arranged in each of the projections or recesses. Consequently, each of the vibration elements can transmit and receive ultrasonic waves having radiation surfaces curved along the surfaces of the projections or recesses.

15 Claims, 24 Drawing Sheets

ULTRASONIC PROBE AND ULTRASONIC DIAGNOSTIC APPARATUS

CROSS-REFERENCE TO RELATED APPLICATIONS

This application is based upon and claims the benefit of priority from prior Japanese Patent Applications No. 2008-029688, filed Feb. 8, 2008; and No. 2009-017535, filed Jan. 29, 2009, the entire contents of both of which are incorporated herein by reference.

BACKGROUND OF THE INVENTION

1. Field of the Invention

The present invention relates to an ultrasonic probe and an ultrasonic diagnostic apparatus using a micromachining ultrasound transducer (MUT).

2. Description of the Related Art

An ultrasonic probe drives a plurality of vibration elements to radiate ultrasonic waves therefrom. The ultrasonic waves reflected by a subject or the like are received by the plurality of vibration elements.

Phase-controlled ultrasonic waves are superposed for delay control of the plurality of vibration elements to form an ultrasonic beam. At this point, the width of the vibration elements is designed to be about half of the wavelength of a center frequency to prevent a reduction in the directivity of the vibration elements.

For example, when the ultrasonic beam is inclined 30 degrees with respect to the center, its sound pressure decreases by about 3 to 6 dB as compared with sound pressure in a 0-degree direction. One reason for this is that the ultrasonic waves are not equally radiated in all directions from the vibration elements. Ultrasonic waves of higher frequencies are more sharply radiated forward and are not uniformly radiated over a wide range. Therefore, in the case of, for example, a harmonic imaging method using a high frequency band, the width of the elements has to be reduced to suit the frequency used. However, a reduced width of the elements decreases production yield or decreases power per element.

In this connection, the vibration element includes an element made mainly of piezoelectric ceramics or a capacitive micromachining ultrasound transducer (cMUT). cMUT is manufactured by processing a semiconductor substrate using a micromachining technique. The element made with piezoelectric ceramics is in the shape of a rectangular parallelepiped, while the cMUT is formed flat. Thus, the ultrasonic radiation surfaces of both types of vibration elements are flat.

Jpn. Pat. Appln. KOKAI Publication No. 2005-210710 describes a technique whereby an array of MUTs formed by flatly arranging a plurality of MUT elements is curved in order to curve the whole ultrasonic radiation surface of the MUT array. The vibration element (MUT element) described in Jpn. Pat. Appln. KOKAI Publication No. 2005-210710 is a flat vibration element.

BRIEF SUMMARY OF THE INVENTION

It is an object of the present invention to provide an ultrasonic probe and an ultrasonic diagnostic apparatus capable of maintaining directivity over a wide range.

An ultrasonic probe according to a first aspect of the present invention comprises: a base having a plurality of projections or recesses; and a plurality of MUT elements arranged in each of the projections or recesses.

An ultrasonic probe according to a second aspect of the present invention comprises: a base having a plurality of projections or recesses arrayed along at least one direction; and a plurality of vibration elements arranged in each of the projections or recesses, each of the vibration elements having ultrasonic radiation surfaces curved along the surfaces of the projections or recesses.

An ultrasonic diagnostic apparatus according to a third aspect of the present invention comprises: an ultrasonic probe according to claim 1; a signal processing unit which subjects an echo signal from the ultrasonic probe to image processing to generate image data; and a display unit which displays the generated image data.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Hereinafter, an ultrasonic probe and an ultrasonic diagnostic apparatus according to embodiments of the present invention will be described with reference to the drawings.

First Embodiment

Figure 1:
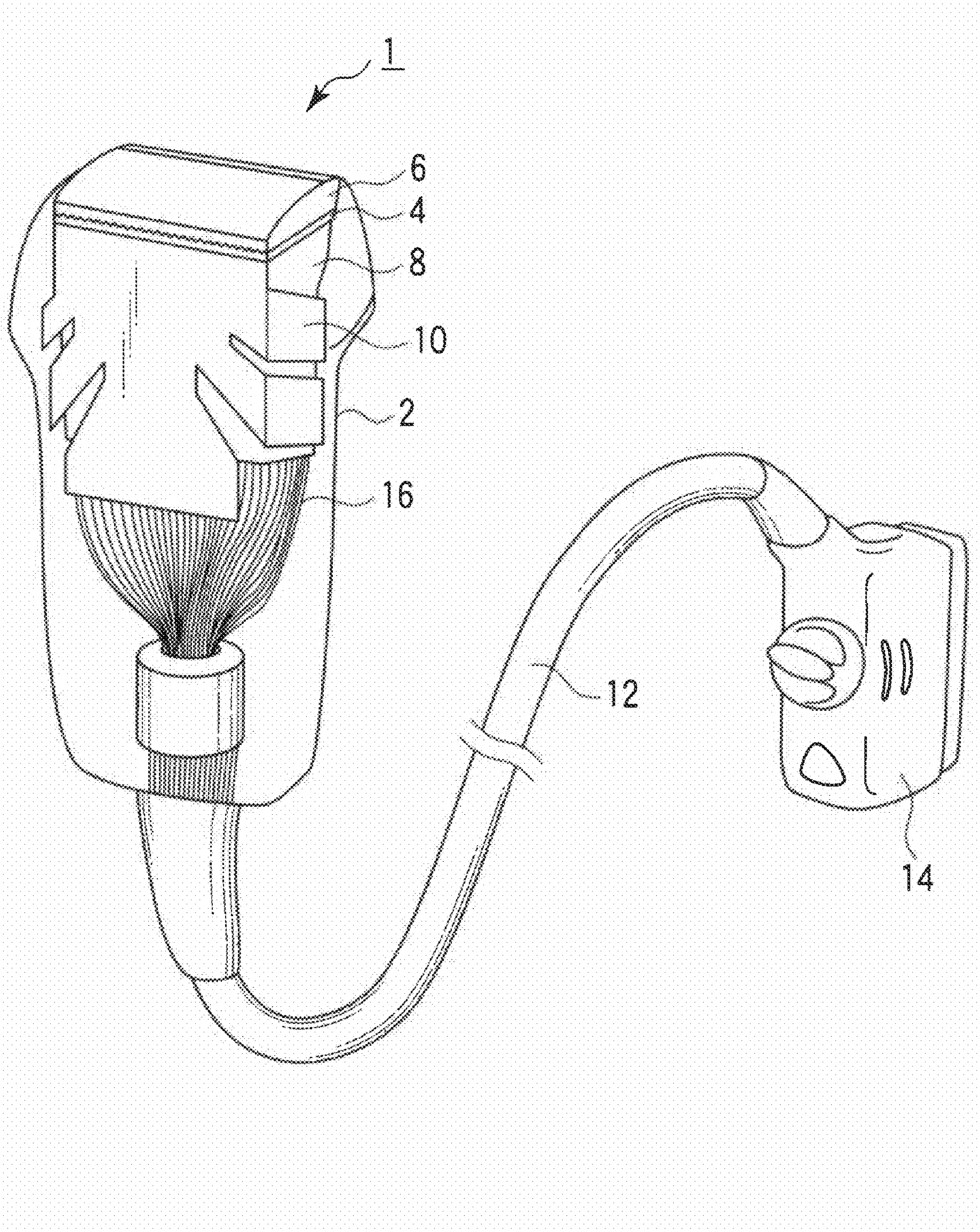
FIG. 1 is a diagram showing the entire configuration of an ultrasonic probe according to a first embodiment of the present invention.

FIG. 1 is a diagram showing the entire configuration of an ultrasonic probe 1 according to a first embodiment of the present invention. As shown in FIG. 1, the ultrasonic probe 1 comprises a probe case 2. A vibration element unit 4 for transmitting and receiving ultrasonic waves is contained within the probe case 2.

Figure 2:
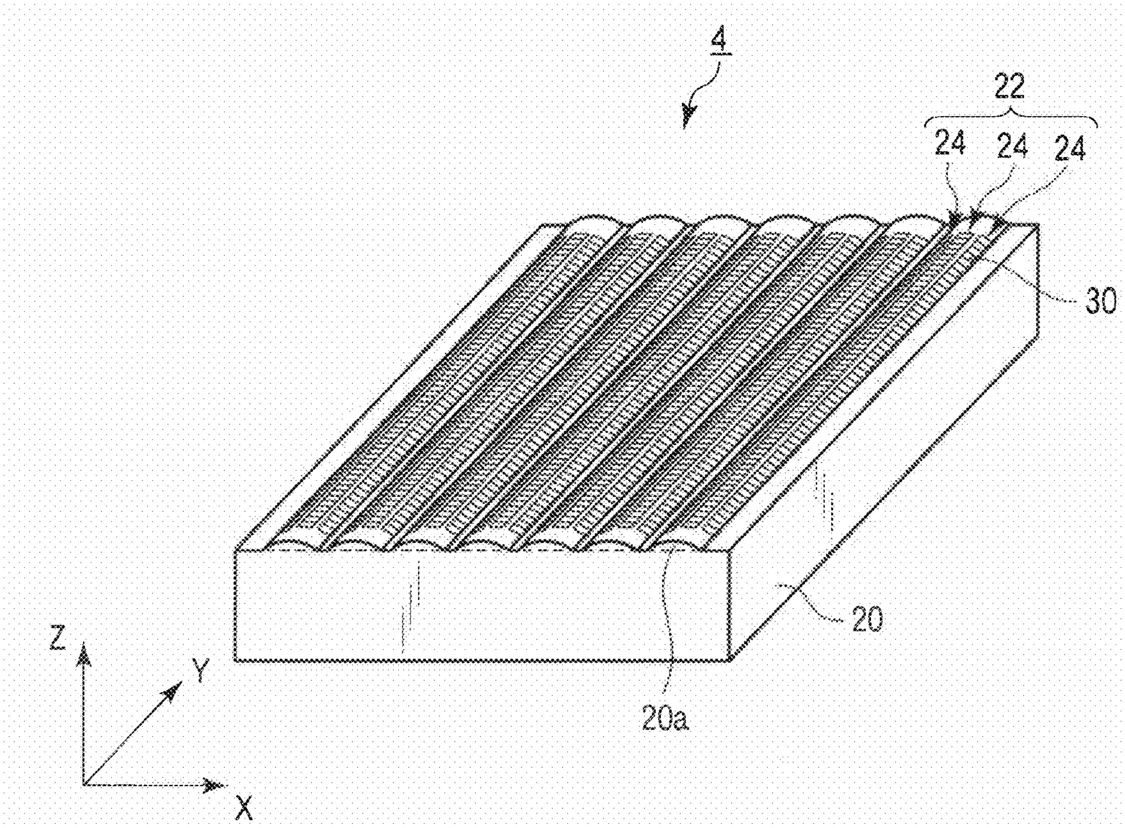
FIG. 2 is a perspective view of a vibrator unit in FIG. 1.
Figure 3:
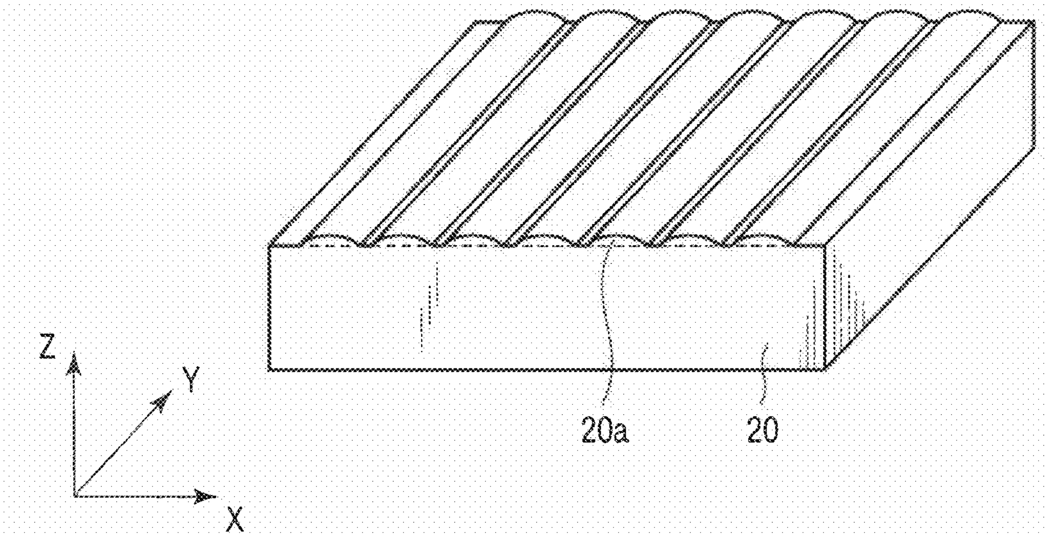
FIG. 3 is a perspective view showing a base in FIG. 2.

FIG. 2 is a perspective view of the vibration element unit 4. As shown in FIG. 2, the vibration element unit 4 has a base 20 formed of a material usable in a semiconductor process, such as a quartz ($SiO_2$) substrate or a silicon (Si) substrate. FIG. 3 is a perspective view showing one example of the base 20. As shown in FIGS. 2 and 3, a plurality of projections (protruded portions) 20*a* elevated in the shape of ridges are arrayed along one direction on the surface of the base 20. That is, the base 20 has a plurality of projecting surfaces. Each of the ridges runs along the one direction. The projection 20*a* has, for example, a semi-cylindrical shape. The array direction of the projections 20*a* is perpendicular to the direction of the central axes of the projections 20*a*. Here, the array direction of the projections 20*a* is defined as an X direction, the direction of the central axes of the projections 20*a* is defined as a Y direction, and the thickness direction of the base 20 perpendicular to the X and Y directions is defined as a Z direction. The projections 20*a* are elevated in the Z direction. The projections 20*a* are arrayed in parallel to each other in the Y direction.

As shown in FIG. 2, a plurality of vibration elements 22 are arranged in the plurality of projections 20*a* of the base 20 through a semiconductor process respectively. Each of the vibration elements 22 has a plurality of micromachining ultrasound transducer (MUT) arrays 24. Each of the MUT arrays 24 has a plurality of MUT elements 30 arrayed along the Y direction. One of the plurality of the MUT arrays 24 included in one vibration element 22 is arranged at the top of the projection 20*a*. The rest of the MUT arrays 24 are arranged at regular intervals on the surface of the projection 20*a*. A signal line is connected to each of the MUT elements 30. The signal lines are bundled into one for each of the vibration elements 22. That is, one vibration element 22 constitutes one channel. More specifically, the plurality of MUT elements 30 arranged in each of the vibration elements 22 combine to constitute one channel. Each of the MUT elements 30 transmits and receives ultrasonic waves. The ultrasonic radiation surface of the vibration element 22 is not flat but is curved along the surface of the projection 20*a*. The MUT element 30 can be any one of a capacitive micromachining ultrasound transducer (cMUT) and a piezoelectric micromachining ultrasound transducer (pMUT). Hereinafter, the MUT elements 30 are cMUT elements.

As shown in FIG. 1, an acoustic lens 6 is affixed to the upper surface of the vibration element unit 4 in such a manner as to be exposed out of the probe case 2. The acoustic lens 6 has a varying thickness along the Y axis, and converges the ultrasonic waves. The acoustic lens 6 also serves to protect the vibration element unit 4.

A backing (not shown) and a support 8 are affixed to the lower surface of the vibration element unit 4. The backing absorbs and damps the ultrasonic waves radiated in the rear of the vibration element unit 4, and the support 8 supports the vibration element unit 4. Moreover, a flexible printed circuit (FPC) board 10 is attached to the side surface of the vibration element unit 4. A plurality of signal lines are printed on the flexible printed circuit board 10 to independently input and output electric signals to and from the plurality of vibration elements 22 included in the vibration element unit 4.

The probe case 2 is connected to a probe connector 14 via a probe cable 12. The probe cable 12 is a covered bundle of cables 16 of the plurality of signal lines. The probe connector 14 is connected to the main unit of the ultrasonic diagnostic apparatus.

Figure 4:
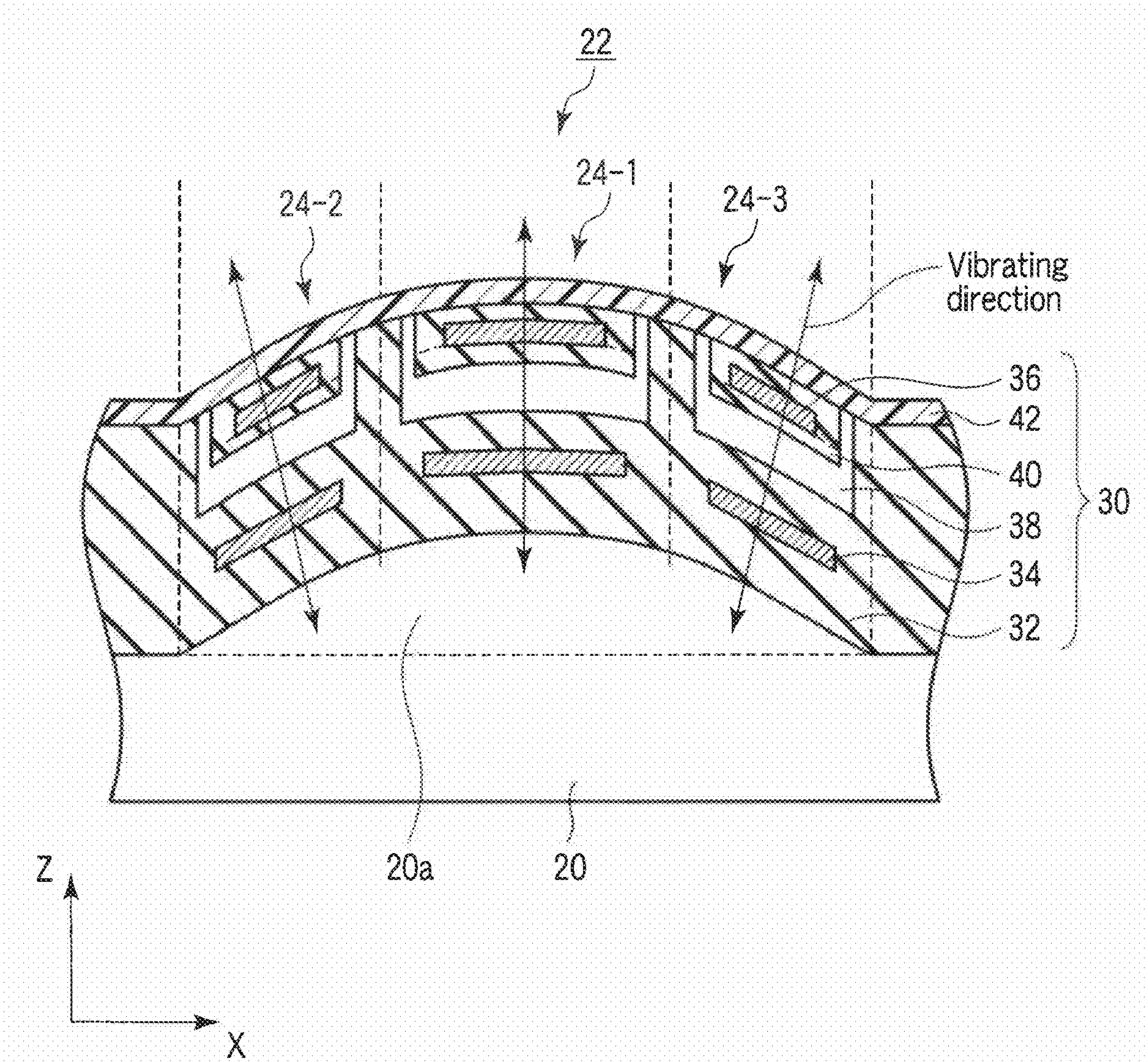
FIG. 4 is a diagram showing the structure of a vibrator element in FIG. 2.

Now, details of the vibration elements 22 are described. Hereinafter, assume that the vibration element 22 has three MUT arrays 24. FIG. 4 is an XZ sectional view through three MUT elements 30 of the three MUT arrays 24 included in one vibration element 22. As shown in FIG. 4, a first MUT array 24-1 is provided at the top of the projection 20*a*, and a second MUT array 24-2 and a third MUT array 24-3 are provided on both sides of the first MUT array. In addition, three or more MUT arrays 24 may be arranged.

Each of the MUT elements 30 comprises a protective layer 32. The protective layer 32 is deposited with a substantially equal thickness on the surface of the projection 20*a*. The material of the protective layer 32 is, for example, silicon nitride (SiN). A bottom electrode 34 and a top electrode 36 are formed inside the protective layer 32 across a cavity 38. The bottom electrode 34 and the top electrode 36 are formed in parallel to each other. The bottom electrode 34 is maintained at a ground potential. The top electrode 36, when used as a signal electrode, has to be shielded by a frame ground to protect a patient, but the frame ground is not described here. Although not shown, the top electrode 36 is connected to a signal line and supplied with an electric signal from the main unit of the ultrasonic diagnostic apparatus. Moreover, the protective layer 32 serves to protect the bottom electrode 34 and the top electrode 36. A vibrating plate 40 is made of the same material as the protective layer 32, and formed integrally with the protective layer 32. The cavity 38 may be filled with air or some other gas, or a vacuum may be formed therein. A resin layer 42 is formed on the upper surface of the protective layer 32 over the cavity 38.

If a time-varying voltage is applied across the bottom electrode 34 and the top electrode 36 via the unshown signal lines, attracting force or repulsive force is generated between the bottom electrode 34 and the top electrode 36 by Coulomb force depending on time. Due to the repetition of the attracting force and repulsive force, the vibrating plate 40 arranged on the lower surface of the top electrode 36 vibrates in a direction substantially perpendicular to the bottom electrode 34 and the top electrode 36 (i.e., a direction perpendicular to the surface of the projection 20*a*). Thus, ultrasonic waves are radiated in the vibrating direction by the vibration of the vibrating plate 40. As described above, the vibration element 22 has the plurality of MUT elements 30 different from each other in vibrating direction. The plurality of MUT elements 30 arranged in the vibration element 22 simultaneously receive a drive signal from the main unit of the ultrasonic diagnostic apparatus, so that the vibration element 22 can radiate ultrasonic waves close to spherical waves. The drive signal supplied to each of the vibration elements 22 is delay-controlled to form a sharp ultrasonic beam.

Figure 5:
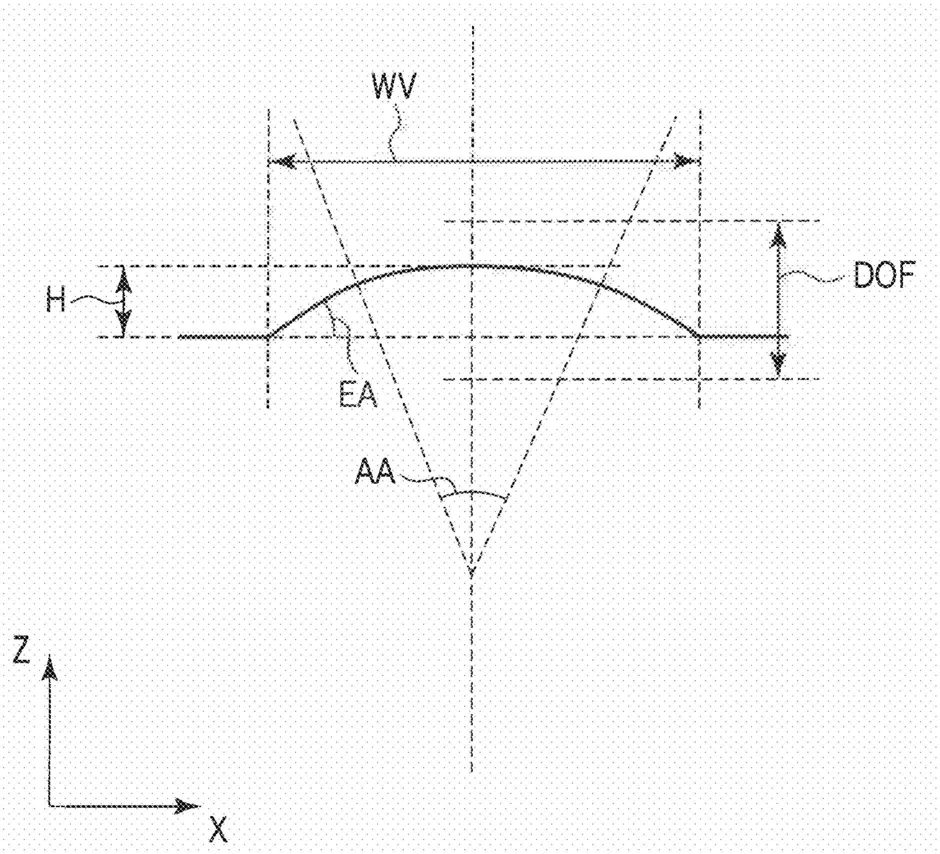
FIG. 5 is a diagram showing the dimensional relation of the vibration element in FIG. 2.

Next, one example of a method of manufacturing the vibration element unit 4 is described. FIG. 5 is a diagram showing one example of the dimensional relation of the vibration element 22. It is specifically noted here that the dimensions of each component of the vibration element unit 4 are not limited to this example. As shown in FIG. 5, a width WV of the vibration element 22 is equal to 250 μm, an interval I between the adjacent vibration elements 22 is equal to 50 μm, a length L of the vibration element 22 is equal to 5 mm, a height H of the vibration element 22 is equal to 33.5 μm, an angle of aperture AA is equal to 30°, a width WM of the MUT element 30 is equal to 60 μm, and a base elevation angle EA at the end of the vibration element 22 is equal to 30°. In addition, the angle of aperture AA is an angle between the vibrating direction of the second MUT array 24-2 of the vibration element 22 and the vibrating direction of the third MUT array 24-3. Moreover, the base elevation angle EA is an angle between a contact surface at the end of the projection 20*a* and a ZY plane.

The vibration element 22 is manufactured on the base 20 by use of a semiconductor process. First, the outline of an exposure system used in a lithography step in the semiconductor process is described. An optical system according to the first embodiment is roughly designed using Equation (1) and Equation (2):

$$\mathrm{DOF}=\pm 0.5\cdot\lambda/\mathrm{NA}^2 \quad (1)$$

$$R=k\cdot\lambda/\mathrm{NA} \quad (2)$$

DOF: Depth of field (depth of focus)

R: Resolution

λ: Wavelength of light used for exposure

NA: Numerical aperture of lens k: Process coefficient (a coefficient determined by process conditions and the material of a resist).

In the first embodiment, the optical system is designed with k=0.8. Moreover, DOF is set about twice as great as the height of the projection 20*a* of the base 20, that is, set at 2'33 μm=66 μm. A krypton fluoride (KrF) excimer laser is used as a light source of the exposure system, and its wavelength is λ=0.284 μm. From these set values and from Equations (1) and (2), resolution R=4.6 μm and numerical aperture NA=0.04 are calculated. Further, the width (pattern rule) of the signal line is set at 10 μm.

In addition, the numerical aperture NA in the first embodiment is smaller than when the base 20 is flat. Accordingly, exposure time in the first embodiment is set to be longer than when the base 20 is flat.

First, a plurality of semi-cylindrical projections 20*a* are formed on the quartz substrate by machining such as dicing and by etching, such that the base 20 as shown in FIG. 3 is formed (step S1). In addition, the projections 20*a* are not exclusively formed by the above-mentioned method. For example, a self-assembly method may be used. Moreover, the material of the base 20 may be cast into a mold to integrally form the base 20 and the projections 20*a*.

Figure 6:
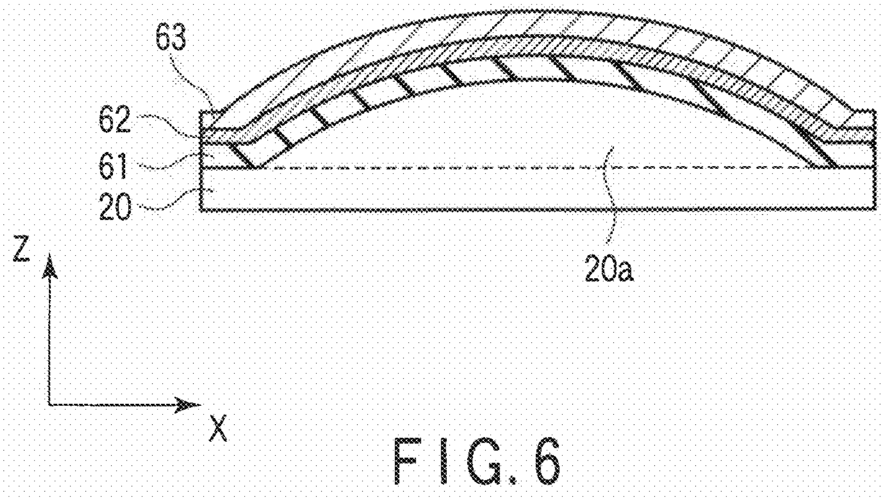
FIG. 6 is a diagram showing step S2 in a process of manufacturing the vibration element in FIG. 2.
Figure 7:
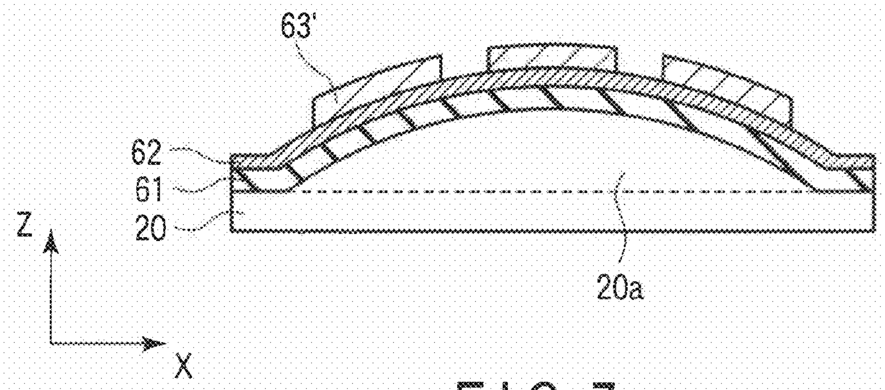
FIG. 7 is a diagram showing step S3 in the process of manufacturing the vibration element in FIG. 2.
Figure 8:
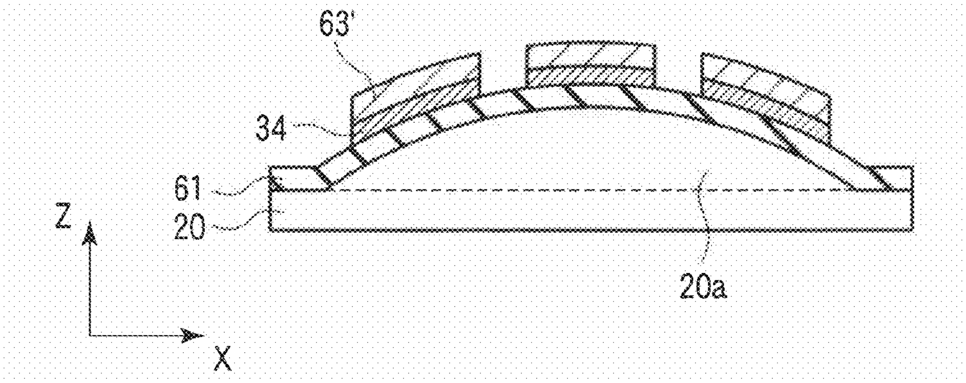
FIG. 8 is a diagram showing step S4 in the process of manufacturing the vibration element in FIG. 2.

After the base 20 has been formed, a first protective layer 61 made of, for example, silicon nitride is formed on the base 20, as shown in FIG. 6. A first electrode layer 62 is formed by sputtering on the upper surface of the formed first protective layer 61. A first resist layer 63 for patterning the bottom electrode is formed on the upper surface of the formed first electrode layer 62 (step S2). Then, as shown in FIG. 7, the exposure system set as described above is used to form a resist pattern 63' for the bottom electrode 34 (step S3). The size of the formed resist pattern 63' is substantially equal to that of the bottom electrode 34. Then, as shown in FIG. 8, the first electrode layer 62 is etched using the formed resist pattern 63' as a mask. Thus, the bottom electrode 34 is formed (step S4).

Figure 9:
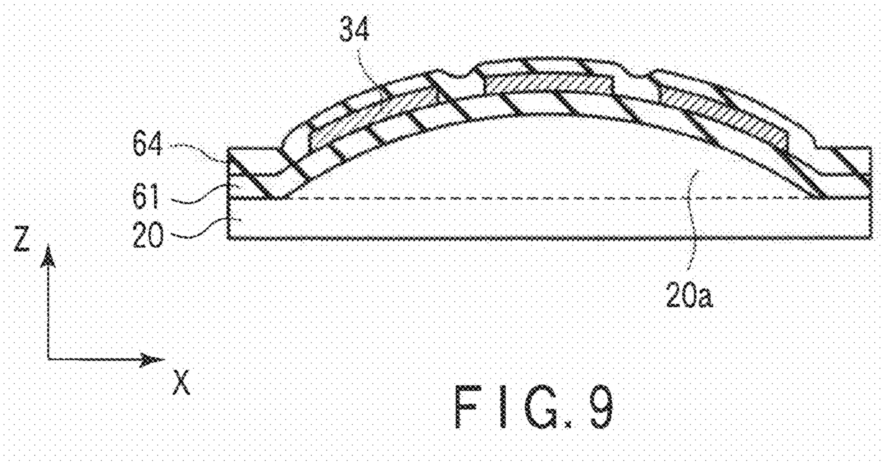
FIG. 9 is a diagram showing step S5 in the process of manufacturing the vibration element in FIG. 2.
Figure 10:
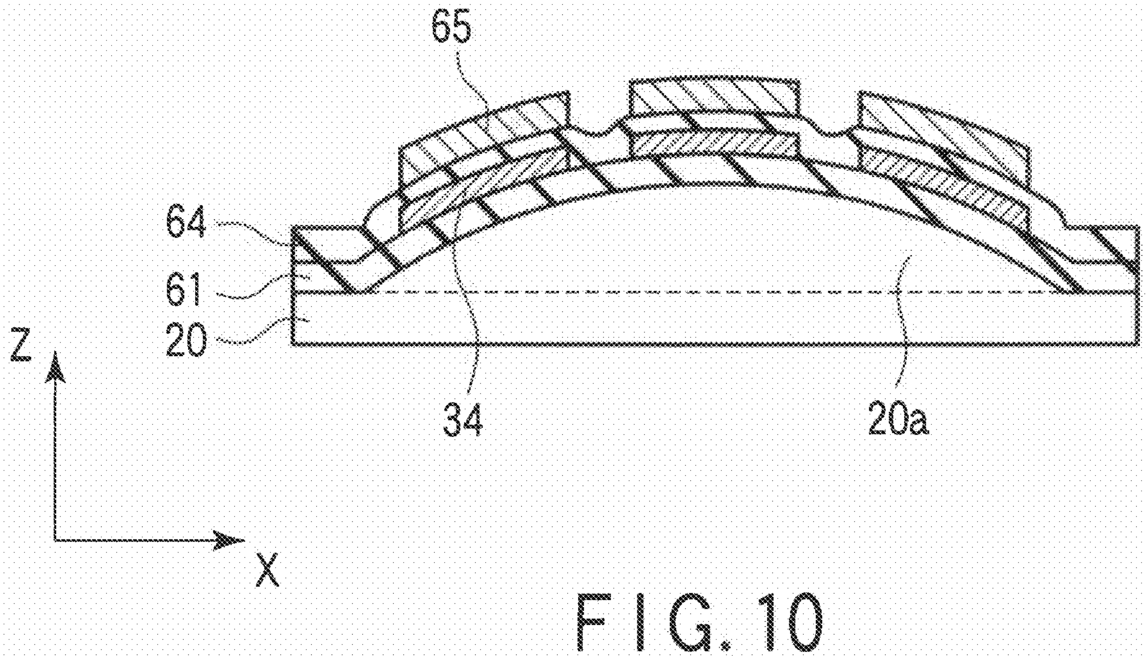
FIG. 10 is a diagram showing step S6 in the process of manufacturing the vibration element in FIG. 2.
Figure 11:
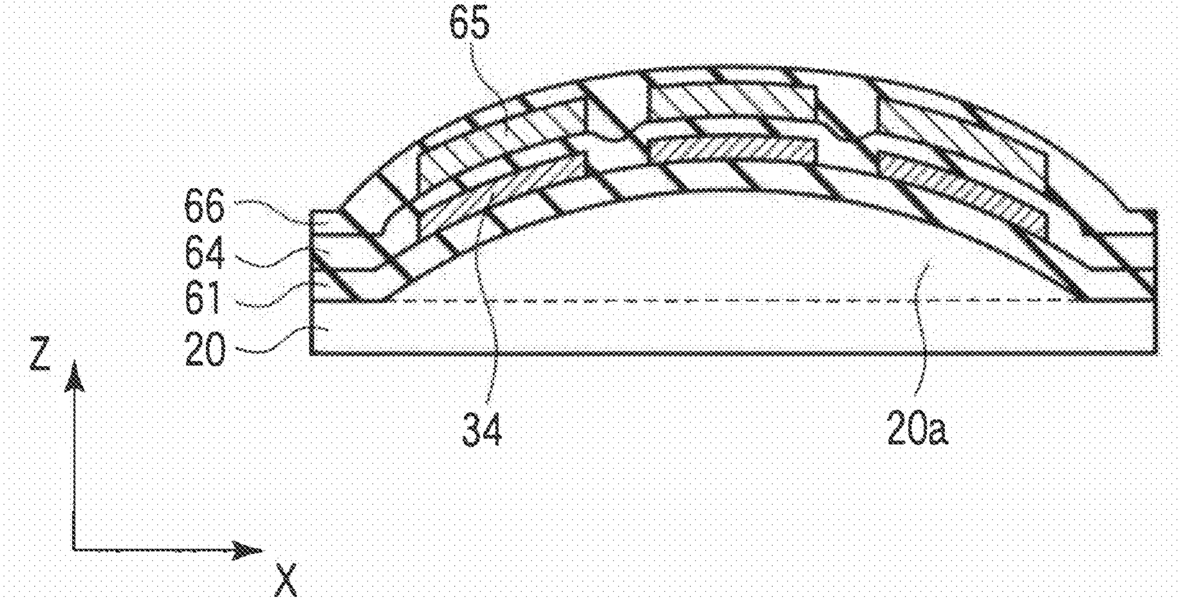
FIG. 11 is a diagram showing step S7 in the process of manufacturing the vibration element in FIG. 2.
Figure 12:
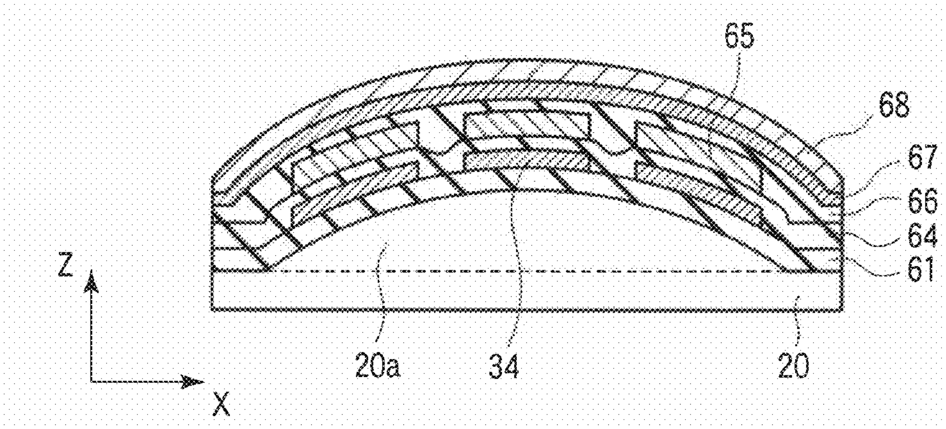
FIG. 12 is a diagram showing step S8 in the process of manufacturing the vibration element in FIG. 2.
Figure 13:
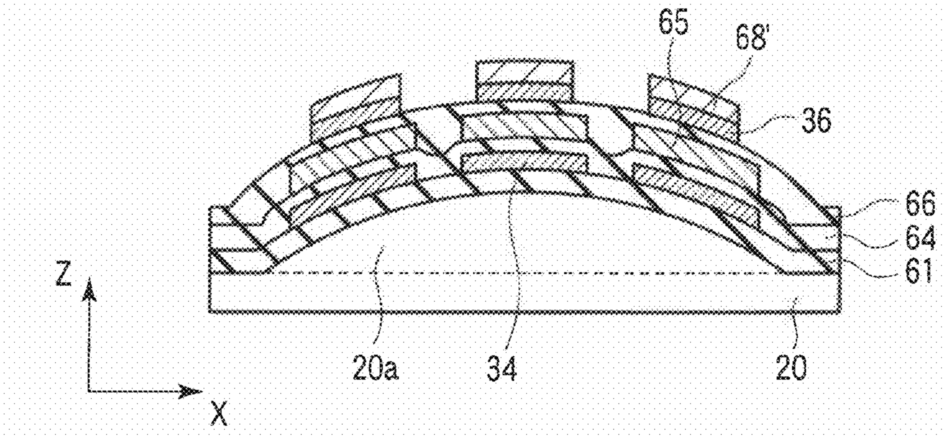
FIG. 13 is a diagram showing step S9 in the process of manufacturing the vibration element in FIG. 2.

After the remaining resist pattern 63' is removed by a remover, a second protective layer 64 for protecting the bottom electrode 34 is formed on the upper surfaces of the formed bottom electrode 34 and the first protective layer 61 as shown in FIG. 9 (step S5). The second protective layer 64 is made of, for example, silicon nitride. After the second protective layer 64 has been formed, a sacrifice layer 65 for a resist to form the cavity 38 is formed on the upper surface of the second protective layer 64 as shown in FIG. 10 (step S6). Then, as shown in FIG. 11, a third protective layer 66 functioning as a protective layer for the top electrode 36 and as the vibrating plate 40 is formed on the upper surface of the sacrifice layer 65 (step S7). The third protective layer 66 is made of, for example, silicon nitride. Then, as shown in FIG. 12, a second electrode layer 67 is formed by sputtering on the upper surface of the third protective layer 66. A resist layer 68 for patterning the top electrode is formed on the upper surface of the formed second electrode layer 67 (step S8). Then, as shown in FIG. 13, the above-mentioned exposure system is used to form a resist pattern 68' for the top electrode 36, and the second electrode layer 67 is etched using the formed resist pattern 68' as a mask. Thus, the top electrode 36 is formed (step S9).

Figure 14:
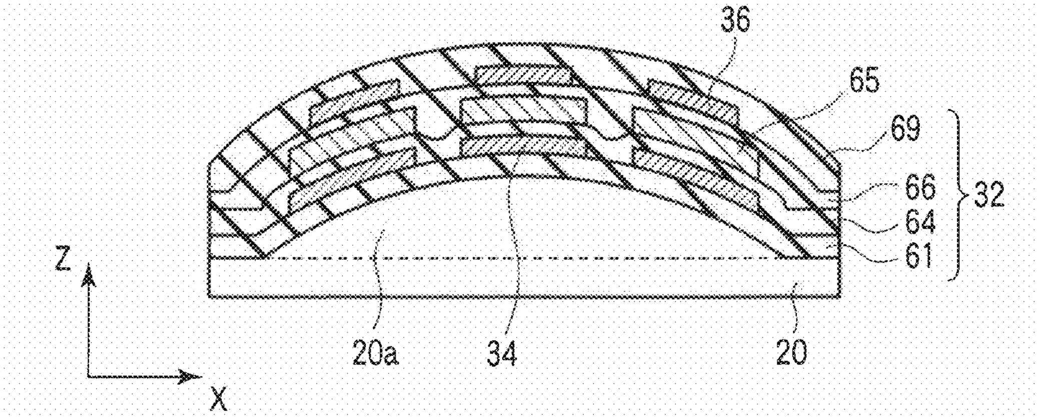
FIG. 14 is a diagram showing step S10 in the process of manufacturing the vibration element in FIG. 2.

After the remaining part of resist pattern 68' is removed by a remover, a fourth protective layer 69 for protecting the top electrode 36 is formed on the upper surface of the formed top electrode 36 as shown in FIG. 14 (step S10). The fourth protective layer 69 is made of, for example, silicon nitride. The first protective layer 61, the second protective layer 64, the third protective layer 66 and the fourth protective layer 69 constitute the protective layer 32.

Figure 15:
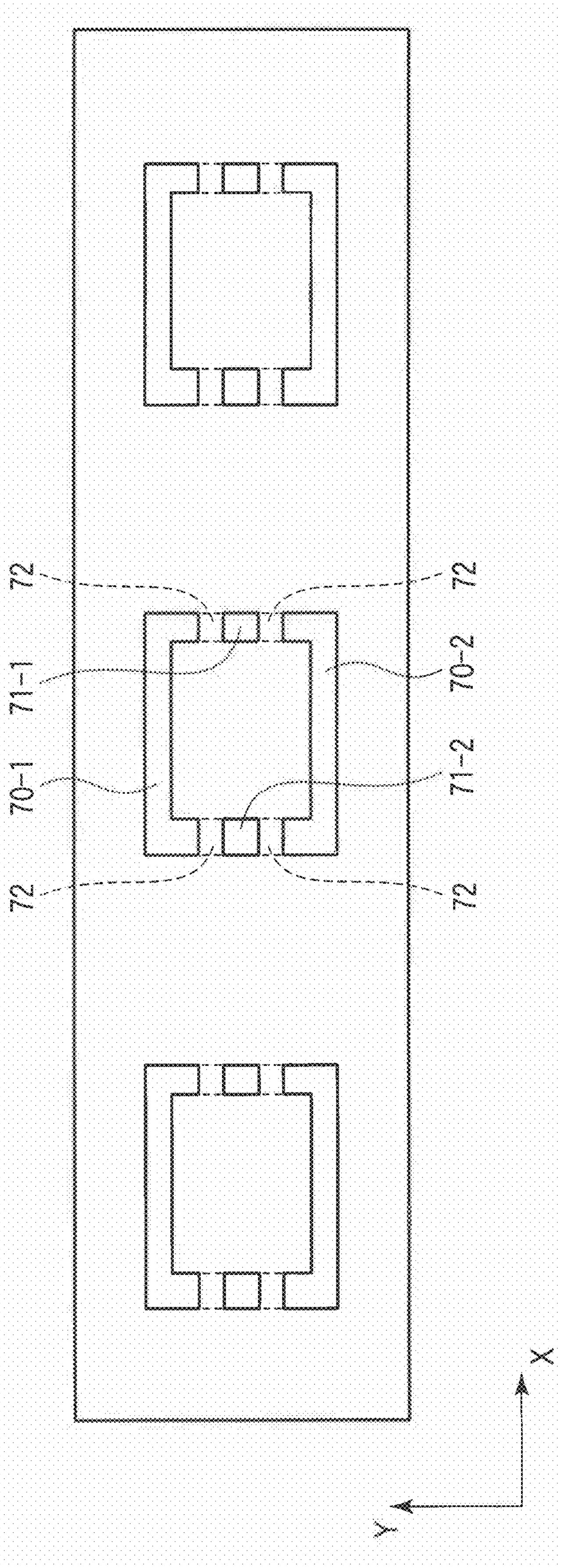
FIG. 15 is a diagram showing step S11 in the process of manufacturing the vibration element in FIG. 2.
Figure 16:
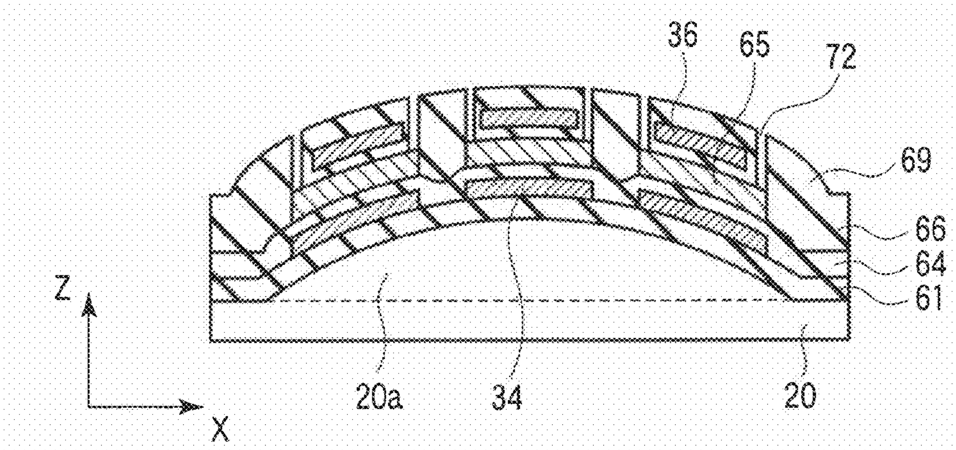
FIG. 16 is another diagram showing step S11 in the process of manufacturing the vibration element in FIG. 2.

Then, as shown in FIGS. 15 and 16, a groove 70 and a vertical hole 71 are formed in the third protective layer 66 and the fourth protective layer 69. The groove 70 and the vertical hole 71 are formed to reach the sacrifice layer 65 from the fourth protective layer 69. The groove 70 and the vertical hole

71 are formed such that the outline of the MUT element 30 is formed (step S11). More specifically, a first groove 70-1, a second groove 70-2, a first vertical hole 71-1 and a second vertical hole 71-2 enclosing the top electrode 36 are formed so that four supports 72 for supporting the top electrode 36 and the vibrating plate 40 may remain.

Figure 17:
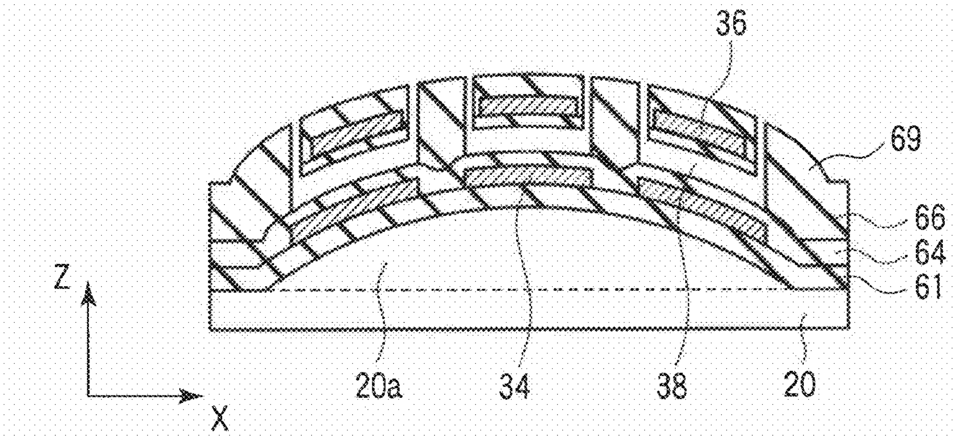
FIG. 17 is a diagram showing step S12 in the process of manufacturing the vibration element in FIG. 2.

Then, as shown in FIG. 17, the formed vertical hole 71 is used to remove the sacrifice layer 65 by a remover, thereby forming the cavity 38 (step S12).

Figure 18:
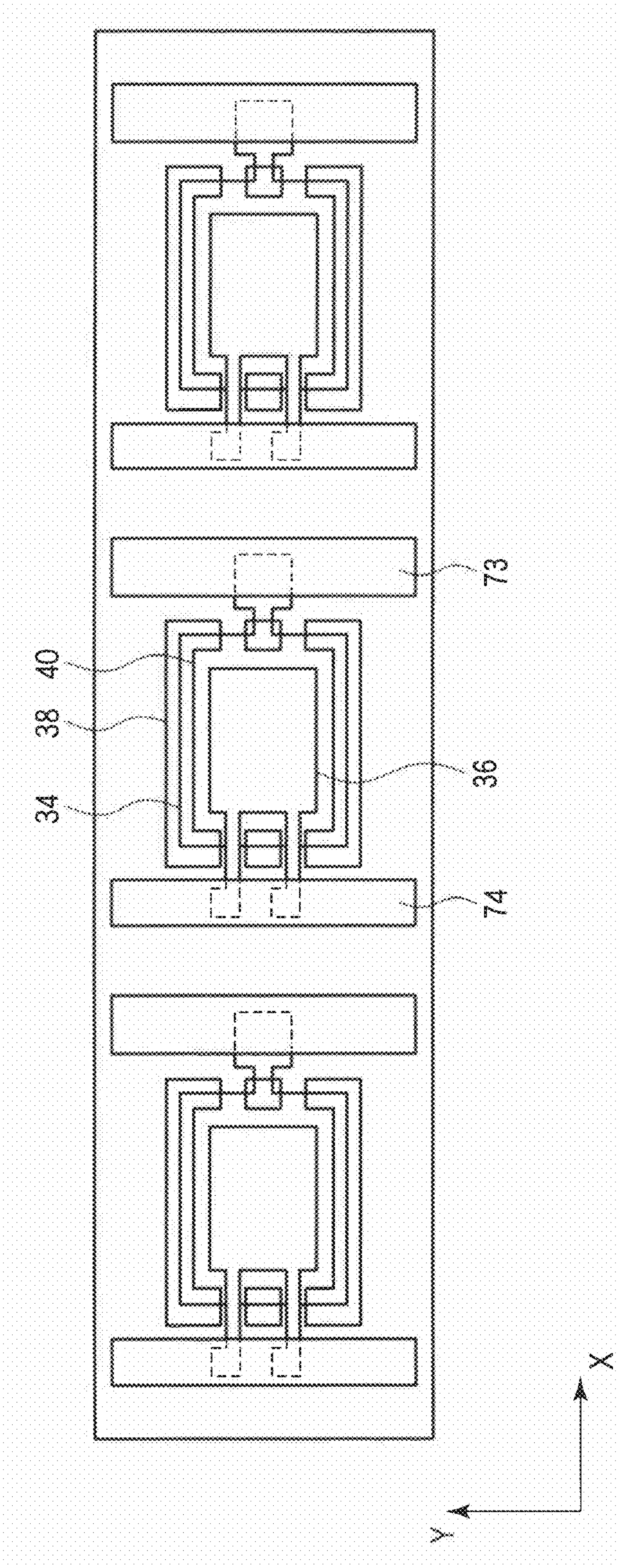
FIG. 18 is a plan view showing the electric system of an MUT element 30 in FIG. 2.

FIG. 18 is a plan view showing an electric system of the MUT element 30. Before the formation of the resin layer 42, a first through-via for drawing the bottom electrode 34 and a second through-via for drawing the top electrode 36 are formed in the fourth protective layer 69. Then, a ground line 73 is connected to the first through-via on the third protective layer 66 or the fourth protective layer 69, and a signal line 74 is connected to the second through-via. Thus, the signal line and the ground line are drawn from the electrodes 34 and 36, respectively. The plurality of MUT elements 30 included in one MUT array 24 is connected to one signal line, and three signal lines of three MUT arrays 24 included in one vibration element 22 are connected to one signal line via the second through-via. That is, one vibration element 22 constitutes one channel.

Figure 19:
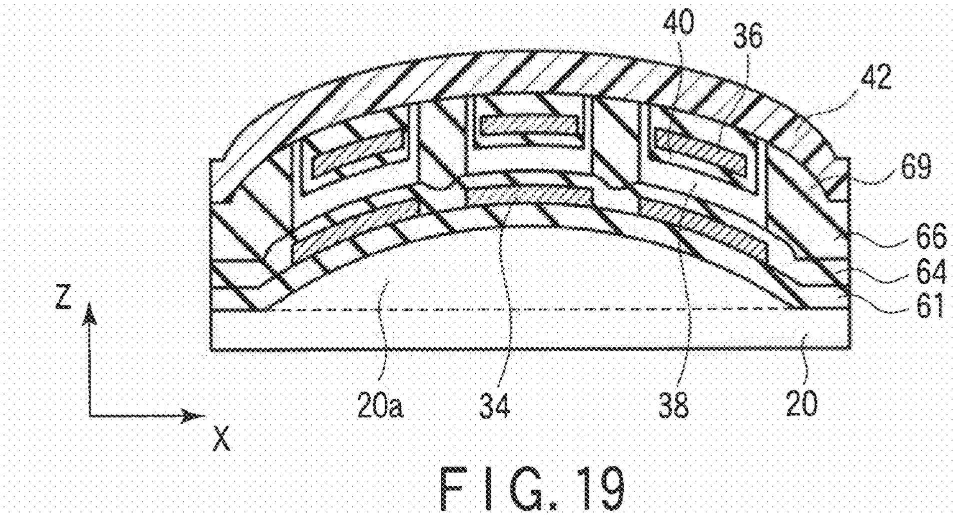
FIG. 19 is a diagram showing step S13 in the process of manufacturing the vibration element in FIG. 2.

After the signal line and the ground line have been drawn, the resin layer 42 for covering the cavity 38 (the vertical hole 71) is formed on the top of the fourth protective layer 69 as shown in FIG. 19 (step S13).

Figure 20:
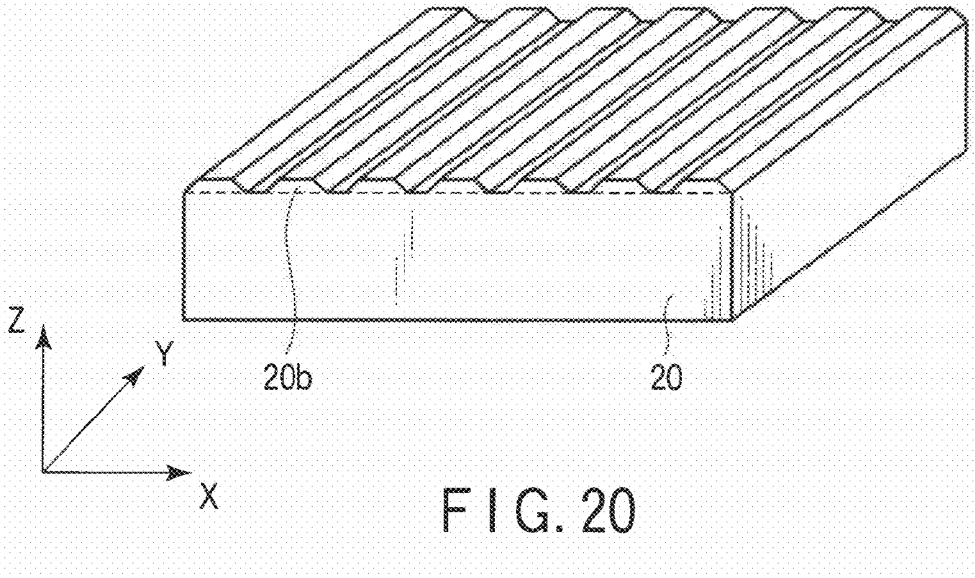
FIG. 20 is a perspective view of an alternative base according to the first embodiment.

The projection 20*a* is semi-cylindrical in the above explanation. However, this is not limitation. For example, a projection 20*b* may have a square columnar shape as shown in FIG. 20. The projection 20*b* is trapezoidal in the XZ section. A vibration element formed in this trapezoidal projection 20*b* is called a square columnar vibration element. Further, the vibration element 22 formed in the above-mentioned semi-cylindrical projection 20*a* is called a semi-cylindrical vibration element 22.

Figure 21:
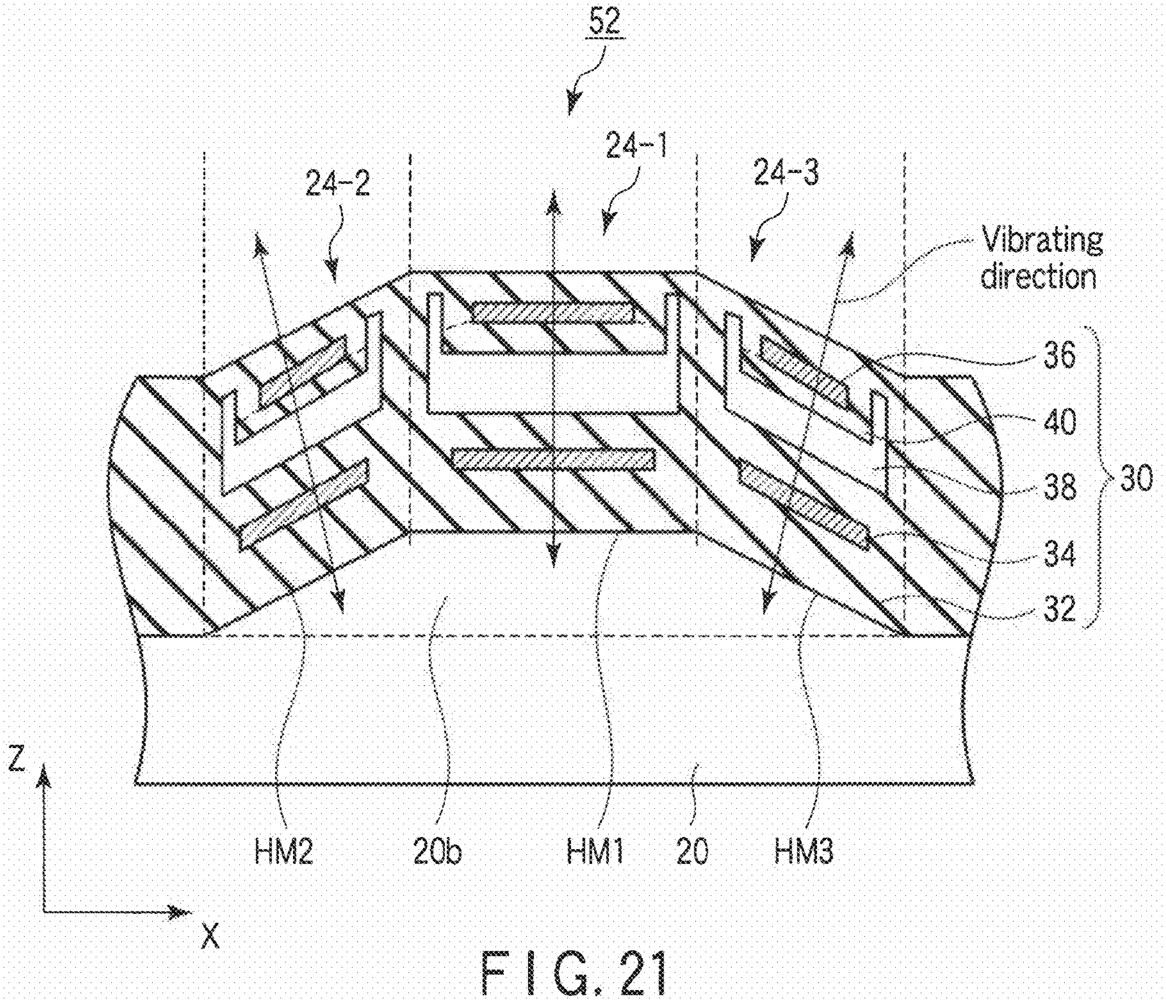
FIG. 21 is a diagram showing the structure of the vibration element equipped with the base in FIG. 20.

FIG. 21 is a diagram showing a ZX section of a square columnar vibration element 52. As shown in FIG. 21, the projection 20*b* has a first plane HM1 perpendicular to the Z axis, and a second plane HM2 and a third plane HM3 which are not parallel to each other. The first MUT array 24-1 is arranged on the first plane HM1, the second MUT array 24-2 is arranged on the second plane HM2, and the third MUT array 24-3 is arranged on the third plane HM3. Each of the square MUT elements 30 is mounted so that its vibrating direction is perpendicular to the plane HM to be arranged. The planes HM1, HM2 and HM3 may be completely flat or may be slightly distorted. The structure of each of the MUT elements 30 included in the MUT arrays 24 is similar to the structure of the MUT element 30 of the semi-cylindrical vibration element 22.

Figure 22:
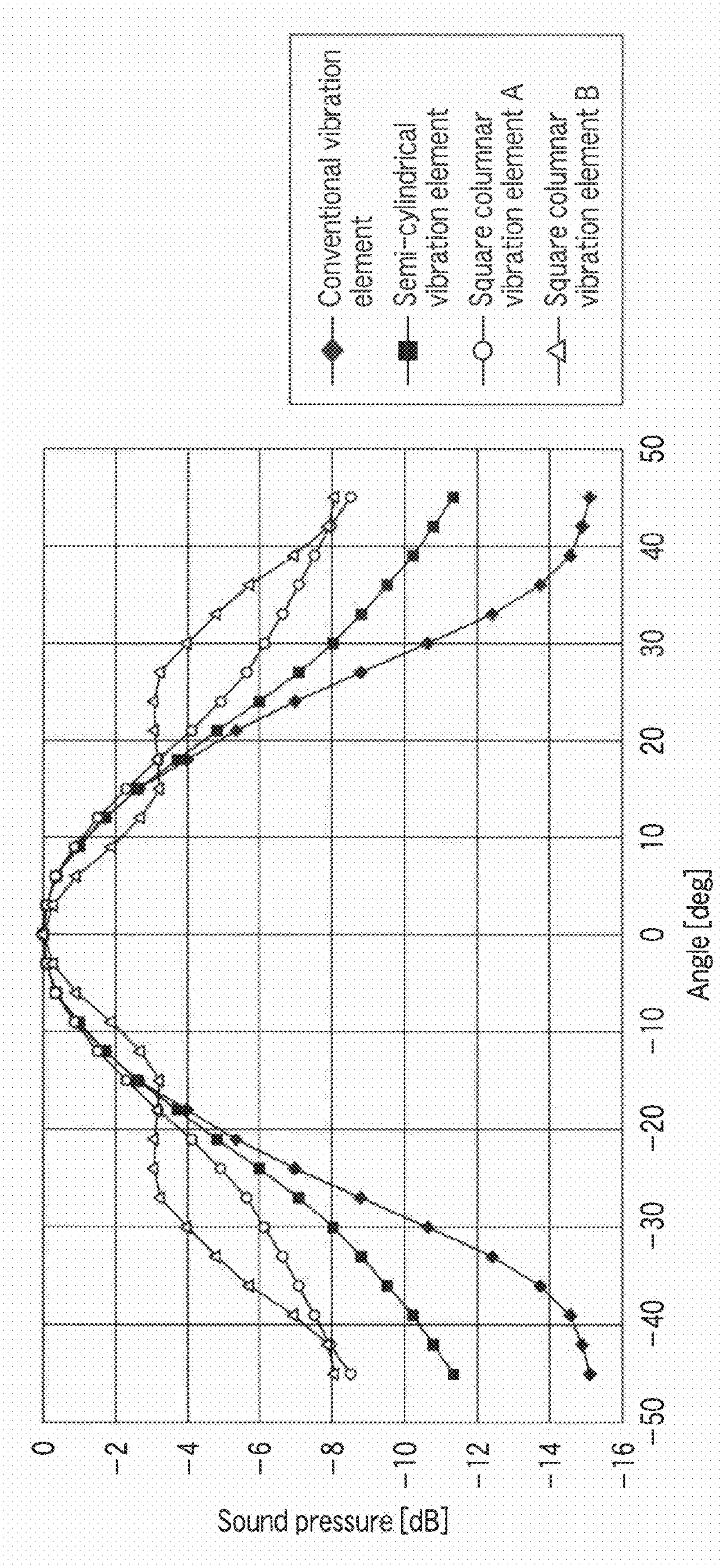
FIG. 22 is a graph showing a simulation result of the directivities of a conventional vibration element, a semi-cylindrical vibration element, a square columnar vibration element A and a square columnar vibration element B.
Figure 23:
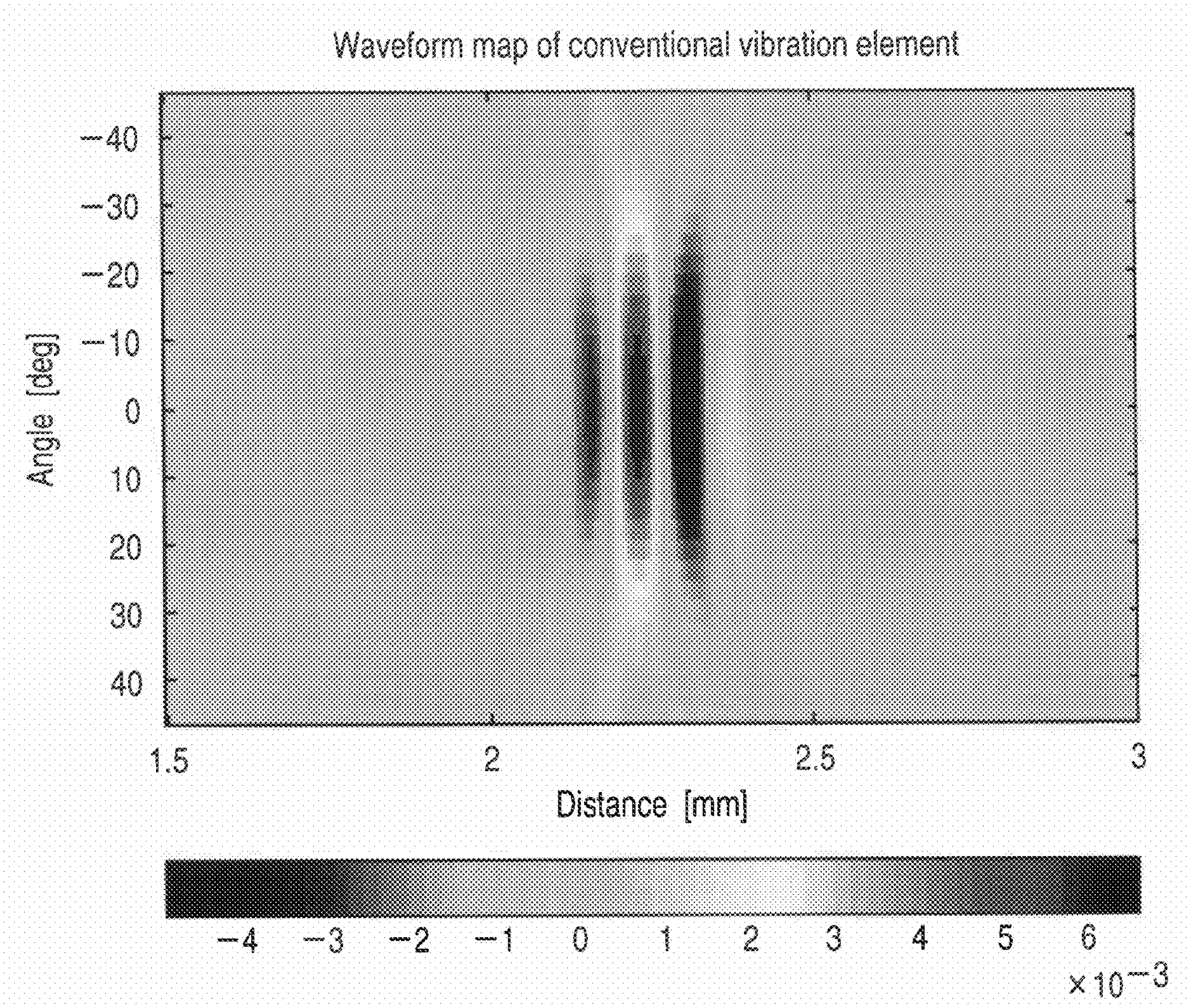
FIG. 23 is a view showing a waveform map of the conventional vibration element.
Figure 24:
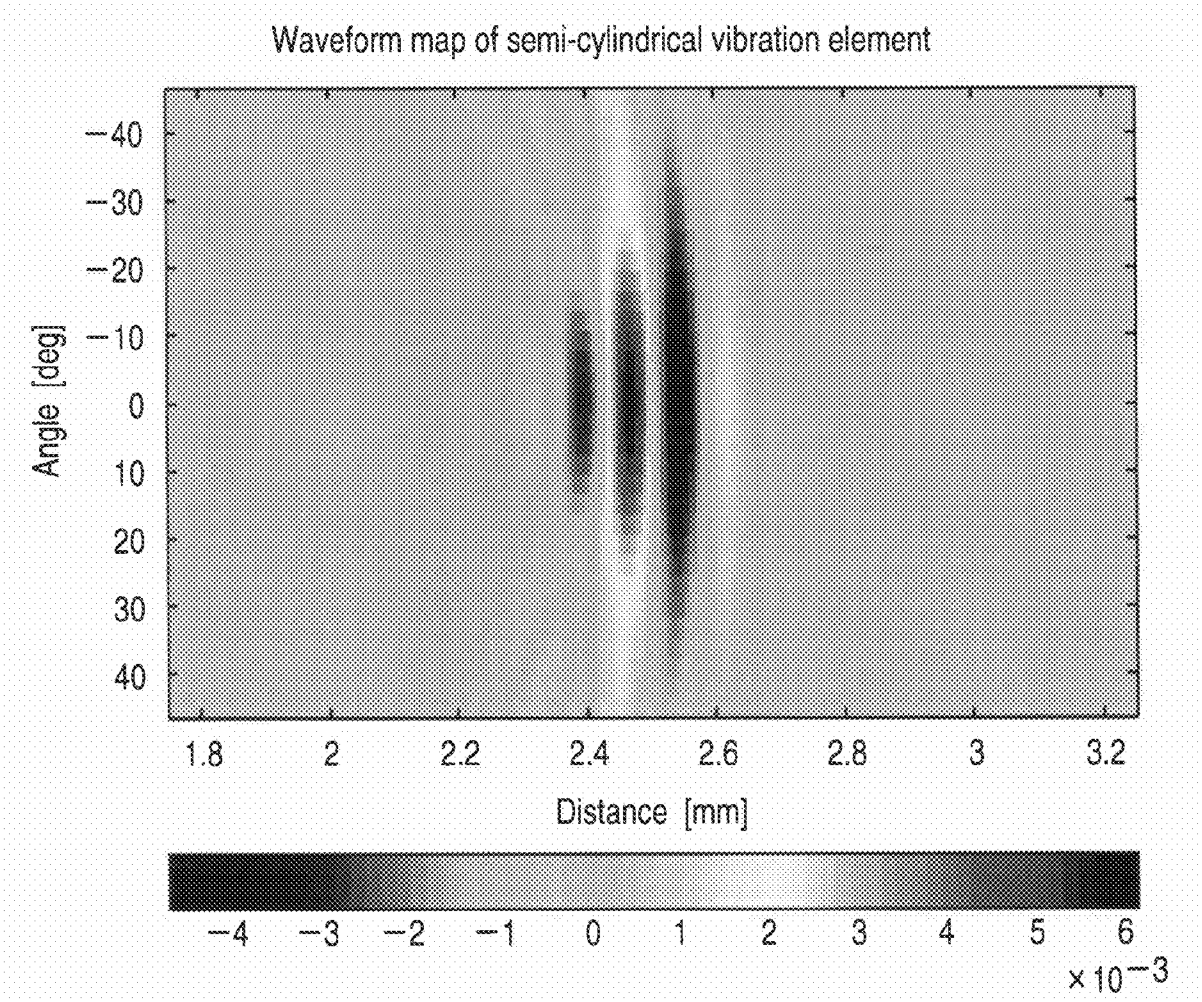
FIG. 24 is a view showing a waveform map of the semi-cylindrical vibration element according to the first embodiment.
Figure 25:
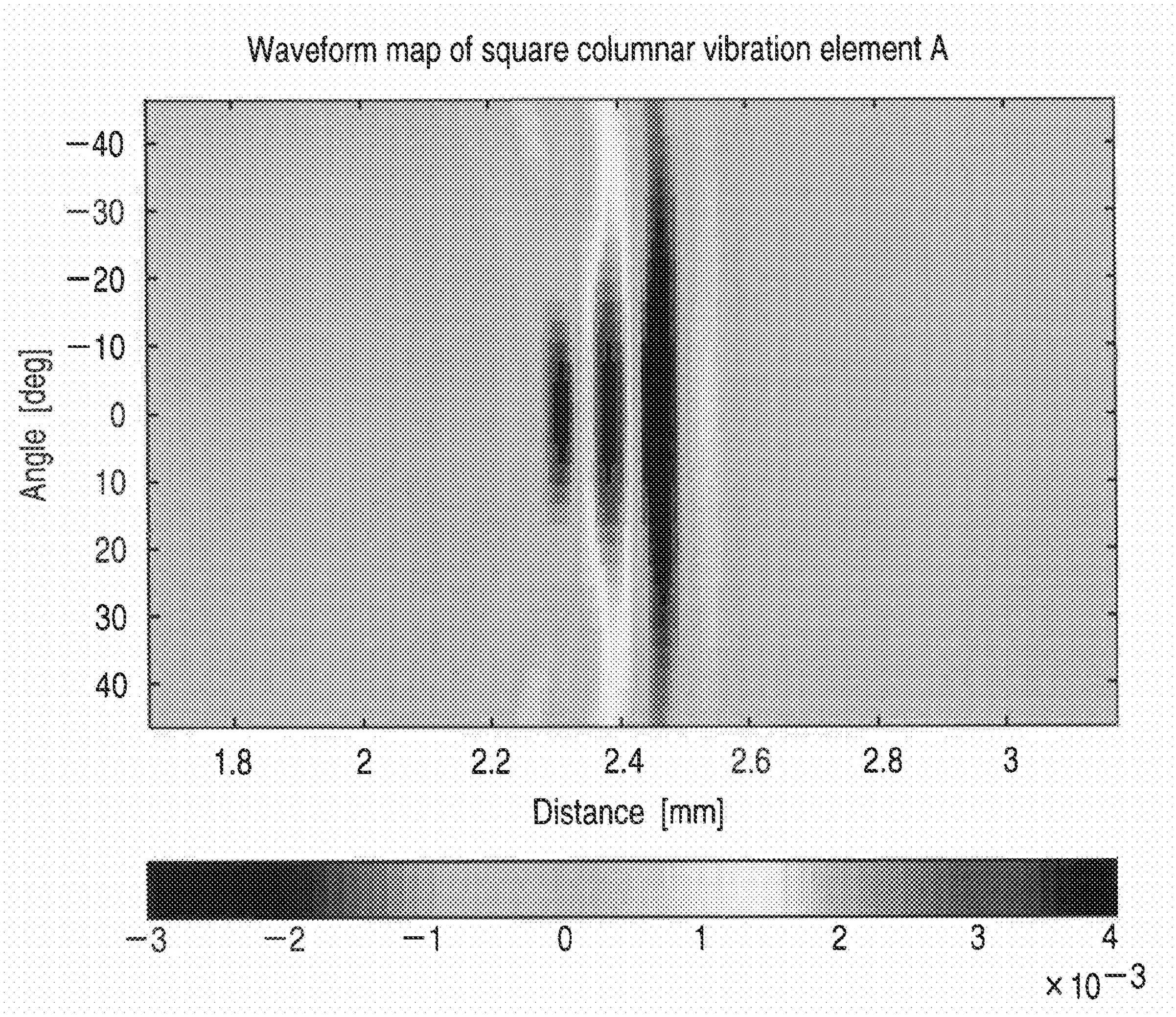
FIG. 25 is a view showing a waveform map of the square columnar vibration element A according to the first embodiment.
Figure 26:
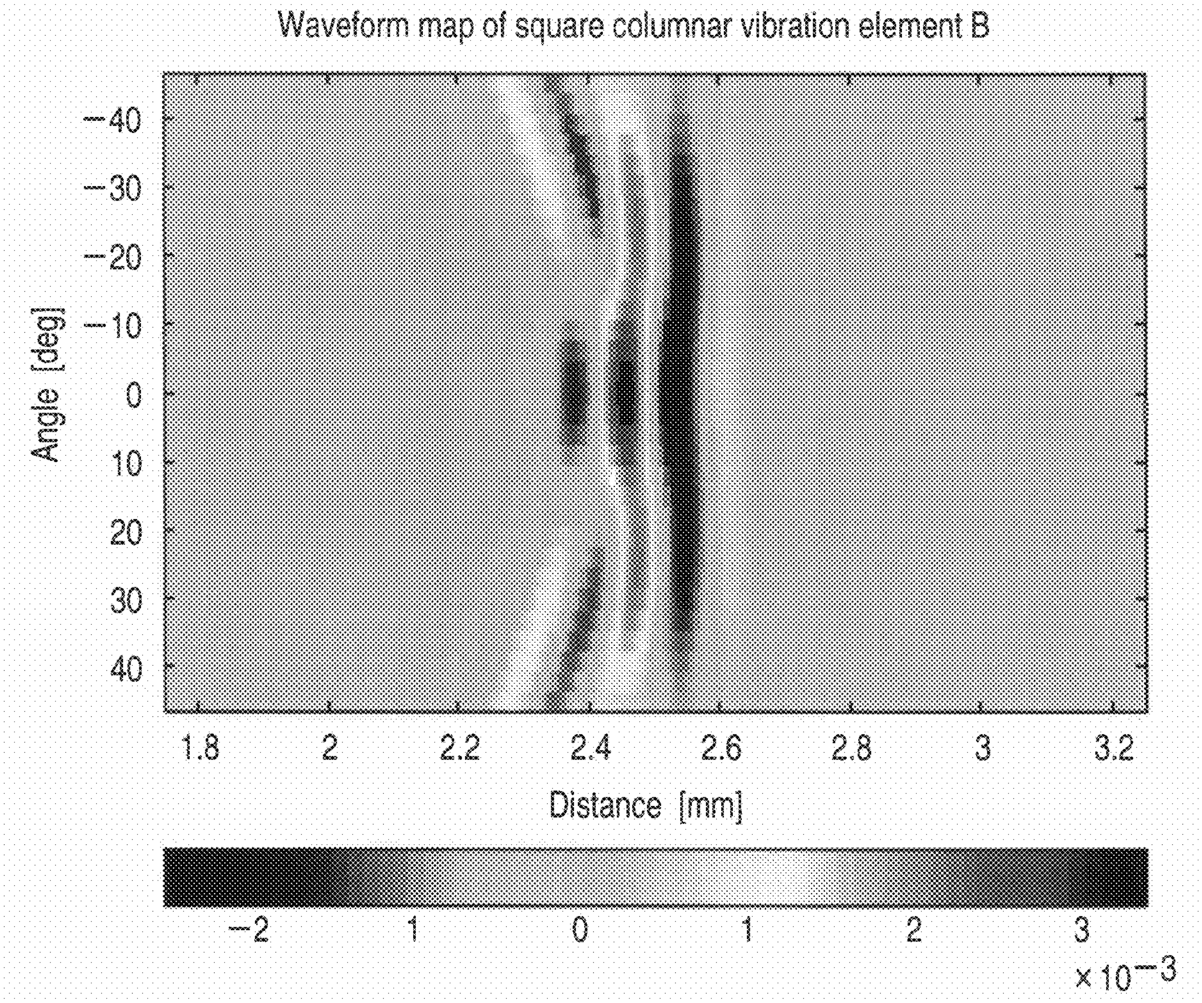
FIG. 26 is a view showing a waveform map of the square columnar vibration element B according to the first embodiment.

Next, the ultrasonic characteristics of the semi-cylindrical vibration element 22 and the square columnar vibration element 52 are described in comparison with the ultrasonic characteristics of a conventional vibration element. FIG. 22 is a graph showing a simulation result of the directivities of the conventional vibration element, the semi-cylindrical vibration element, a square columnar vibration element A and a square columnar vibration element B.

The conventional vibration element is a piezoelectric element made of a piezoelectric ceramic. The width of the piezoelectric element used is 250 μm. The width of the piezoelectric element is designed to be half an ultrasonic wavelength. Therefore, the piezoelectric element 250 μm thick is optimum for a frequency band of transmitted ultrasonic waves of 3 MHz. On the other hand, in the case where a harmonic imaging method is used, a high band of, for example, 6 MHz is required for the transmitted ultrasonic waves. For ease of comparison of performances, a higher band of 10 MHz is taken as an example here for a simulation. For reference, an optimum width of the piezoelectric element in a conventional method is about 75 μm at a band of 10 MHz. The simulation is run here assuming 250 μm which is much greater than the element width ideal in the conventional method. That is, the width of the conventional vibration element shown in FIG. 2 is 250 μm.

With regard to the square columnar vibration element A, the vibration element width WV is equal to 250 μm, and a radius Re of an inscribed circle inscribed in the three planes HM1, HM2 and HM3 is equal to 170 μm. With regard to the square columnar vibration element B, the element width WV is equal to 366 μm, and a radius Re of an inscribed circle inscribed in the three planes is equal to 250 μm. The width of the MUT element is 60 μm in both the square columnar vibration element A and the square columnar vibration element B.

In the case of the simulation result in FIG. 22, the transmitted ultrasonic waves of all the vibration elements are at 10 MHz. 0 deg is in a Z axis direction in the case where the center of the ultrasonic radiation surface is coincident with the origin of the XYZ coordinates. The angle [deg] indicates the angle of inclination of a point located at a distance from the center of the ultrasonic radiation surface toward the X axis from the Z axis. Sound pressure [dB] is relative sound pressure in the case where a sound pressure at 0 deg is 0 dB. Ideally, it is desirable that the sound pressure should not change with the angle. In addition, the plurality of MUT elements included in the semi-cylindrical vibration element, the square columnar vibration element A and the square columnar vibration element B simultaneously radiate ultrasonic waves. That is, the drive signal to the MUT elements is not delay-controlled.

As shown in FIG. 22, with regard to the directivity of the conventional vibration element, the sound pressure at 45 deg has decreased to about −15 dB as compared with the sound pressure at 0 deg. The directivity of the semi-cylindrical vibration element is improved in contrast with the directivity of the conventional vibration element, so that the sound pressure at 45 deg is less decreased to about −11 dB as compared with the sound pressure at 0 deg. The directivity of the square columnar vibration element A is improved in contrast with the directivity of the conventional vibration element, so that the sound pressure at 45 deg is less decreased to about −9 dB as compared with the sound pressure at 0 deg. The directivity of the square columnar vibration element B is improved in contrast with the directivity of the semi-cylindrical vibration element, so that the sound pressure at 45 deg is less decreased to about −8 dB as compared with the sound pressure at 0 deg.

FIGS. 23, 24, 25 and 26 are views showing waveform maps of the conventional vibration element, the semi-cylindrical vibration element, the square columnar vibration element A and the square columnar vibration element B, respectively. In the waveform maps, the horizontal axis indicates the distance [mm] from the center of the ultrasonic radiation surface while the vertical axis indicates the angle [deg], and a sound pressure value at each point is represented by the depth of gray. It is ideal that dark gray parts be vertically straight. In other words, it is ideal that a part with higher or lower sound pressure be located at a certain distance. As shown in FIGS. 23, 24, 25 and 26, the directivities of the semi-cylindrical vibration element and the square columnar vibration element A according to the first embodiment are better than the directivity of the conventional vibration element. The directivity of the square columnar vibration element B is slightly deviated from the ideal directivity due to the fact that the design parameter of this vibration element is too great. Thus, it is apparent from the sound pressure distribution and the waveform maps that the square columnar vibration element A is proper in terms of the element shape. The shape of the square columnar vibration element A is similar to the shape used for explaining FIG. 5 and FIG. 21.

Figure 27:
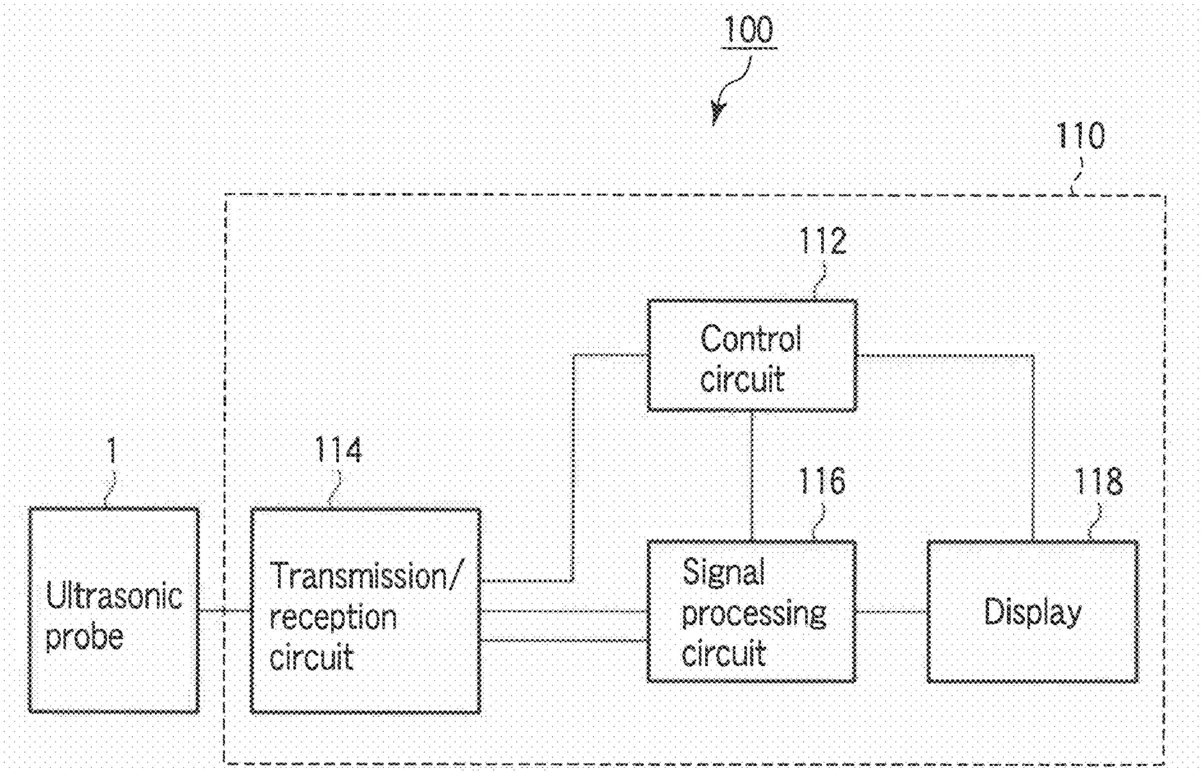
FIG. 27 is a diagram showing the configuration of an ultrasonic diagnostic apparatus according to the first embodiment.

Next, the ultrasonic diagnostic apparatus equipped with the ultrasonic probe 1 is described. FIG. 27 is a diagram showing the configuration of an ultrasonic diagnostic apparatus 100. As shown in FIG. 27, the ultrasonic diagnostic apparatus 100 comprises the ultrasonic probe 1 and an ultrasonic diagnostic apparatus main unit 110. The ultrasonic diagnostic apparatus main unit 110 includes a control circuit 112 as a center, a transmission/reception circuit 114, a signal processing circuit 116 and a display 118.

The transmission/reception circuit 114 generates a drive signal for radiating ultrasonic waves, and supplies the generated drive signal to the vibration elements 22 to cause the vibration elements 22 to radiate ultrasonic waves. The transmission/reception circuit 114 also delays and adds echo signals supplied from the vibration elements 22. The signal processing circuit 116 subjects the echo signals supplied from the transmission/reception circuit 114 to image processing to generate image data. The generated image is, by way of example, a B mode image or a Doppler image. The display 118 displays the generated image (e.g., the B mode image or Doppler image).

In such a configuration, the vibration element unit 4 has the vibration element 22 or vibration element 52 in which the plurality of MUT elements 30 are arranged in the projections 20*a* or projections 20*b*. Thus, the ultrasonic radiation surface of the vibration element 22 or vibration element 52 is not flat but convex. As a result, the individual vibration elements 22 or vibration elements 52 can radiate ultrasonic waves close to spherical waves on a high frequency band as compared with the conventional vibration elements with the flat ultrasonic radiation surfaces. Consequently, according to the first embodiment, it is possible to provide an ultrasonic probe and an ultrasonic diagnostic apparatus capable of maintaining directivity over a wide range without forcing a small width of the vibration elements.

In addition, the base 20 has the plurality of projections 20*a*, 20*b* in the first embodiment. However, the first embodiment is not exclusively limited to this, and the base 20 may have a plurality of recesses (depressed portions). In this case, the plurality of vibration elements are arranged in the plurality of respective recesses respectively. Moreover, the plurality of MUT elements 30 are arranged in each of the recesses.

Second Embodiment

Figure 28:
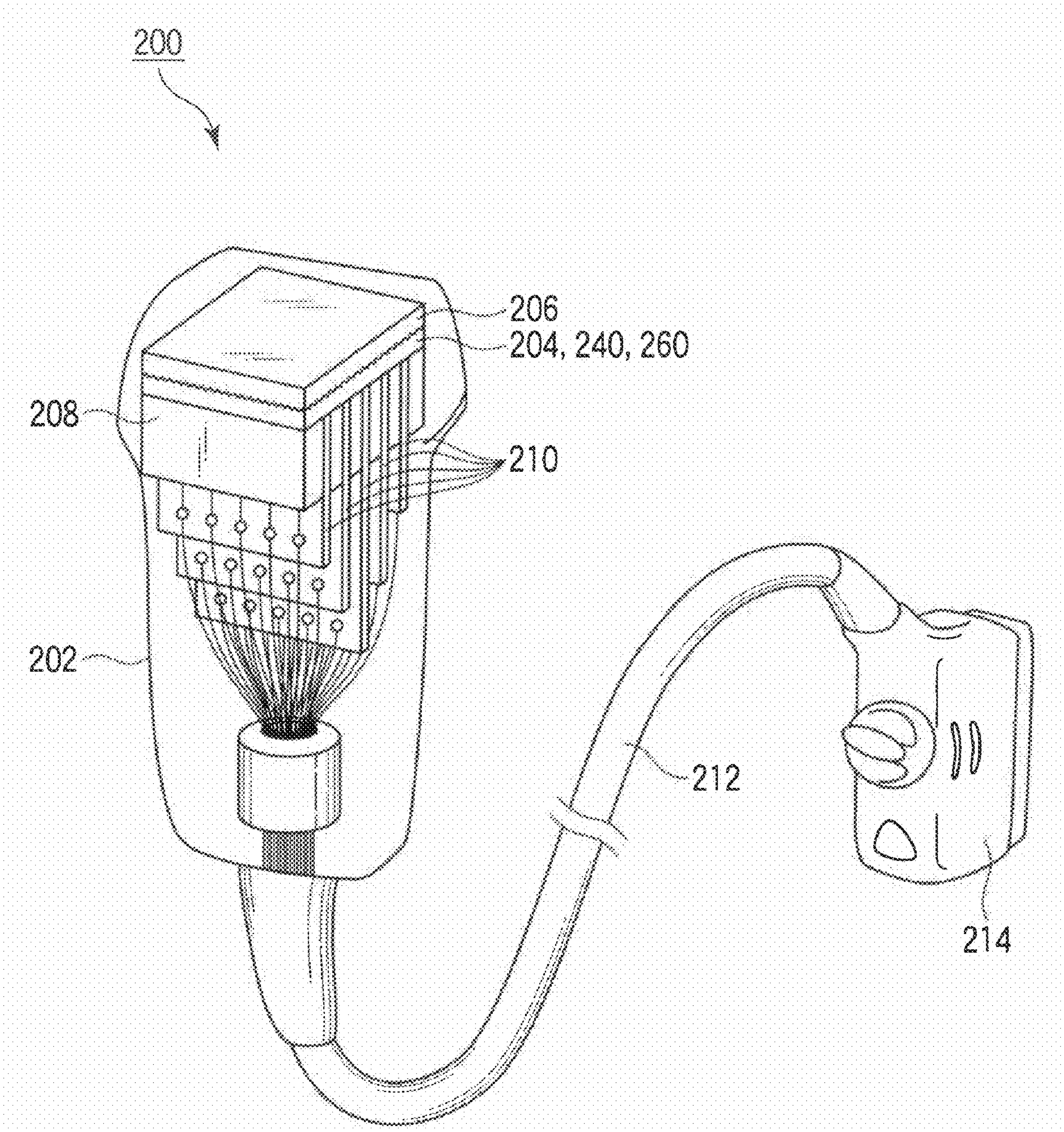
FIG. 28 is a diagram showing the entire configuration of an ultrasonic probe according to a second embodiment of the present invention.

FIG. 28 is a diagram showing the entire configuration of an ultrasonic probe 200 according to a second embodiment of the present invention. As shown in FIG. 28, the ultrasonic probe 200 comprises a probe case 202. A vibration element unit 204 for transmitting and receiving ultrasonic waves is contained within the probe case 202. An acoustic lens 206 is affixed to the upper surface of the vibration element unit 204 in such a manner as to be exposed out of the probe case 202. The acoustic lens 206 is, for example, formed into a substantially square shape. A support 208 is attached to the lower surface of the vibration element unit 204. Moreover, a plurality of flexible printed boards 210 are attached to the lower surface of the vibration element unit 204 through the support 208. A plurality of signal lines 216 for independently inputting and outputting electric signals to and from the vibration elements 222 are printed on the flexible printed boards 210. The probe case 202 is connected to a probe connector 214 via a probe cable 212. The probe connector 214 is connected to the main unit of the ultrasonic diagnostic apparatus.

Figure 29:
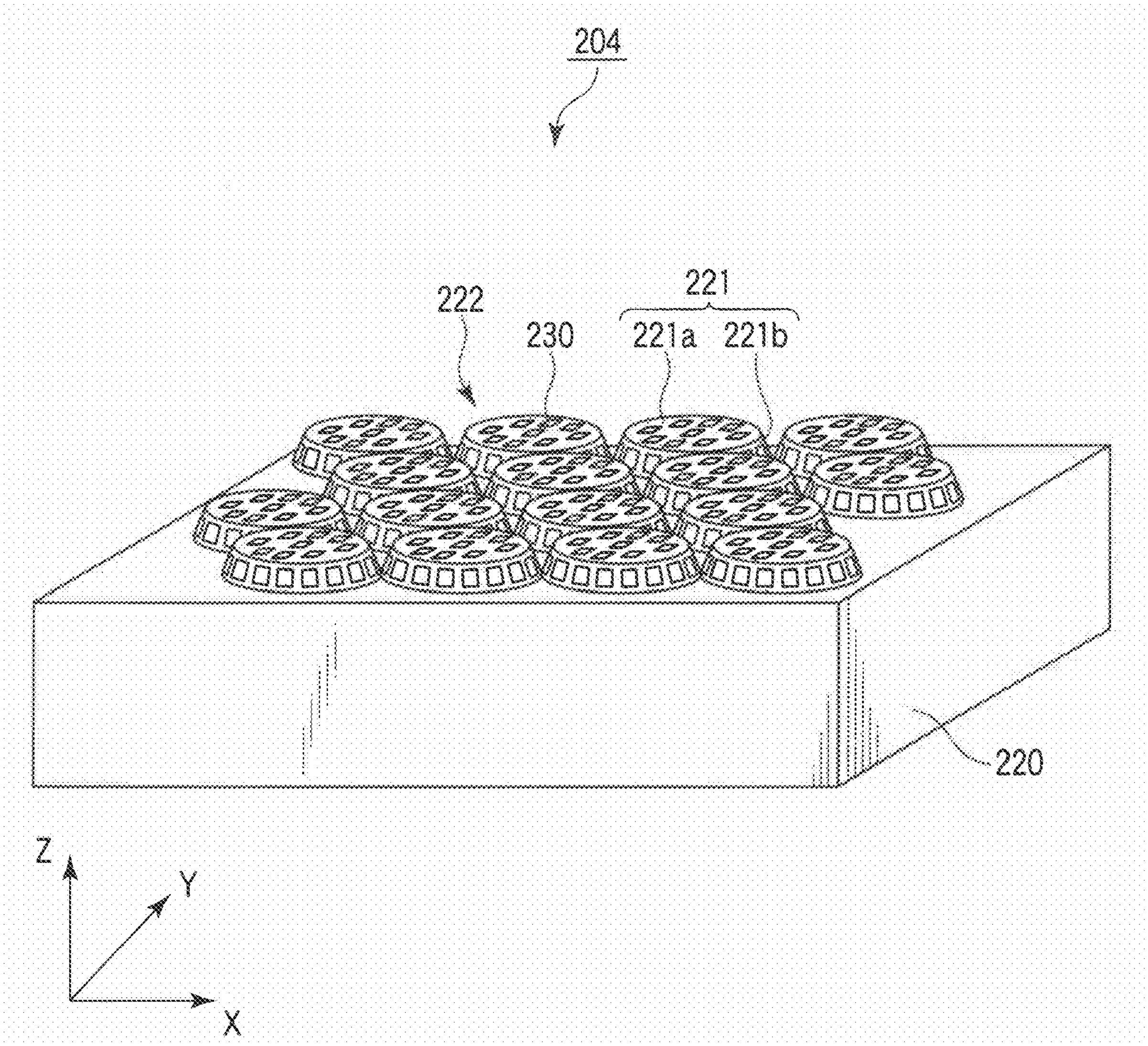
FIG. 29 is a perspective view of a vibrator unit in FIG. 28.
Figure 30:
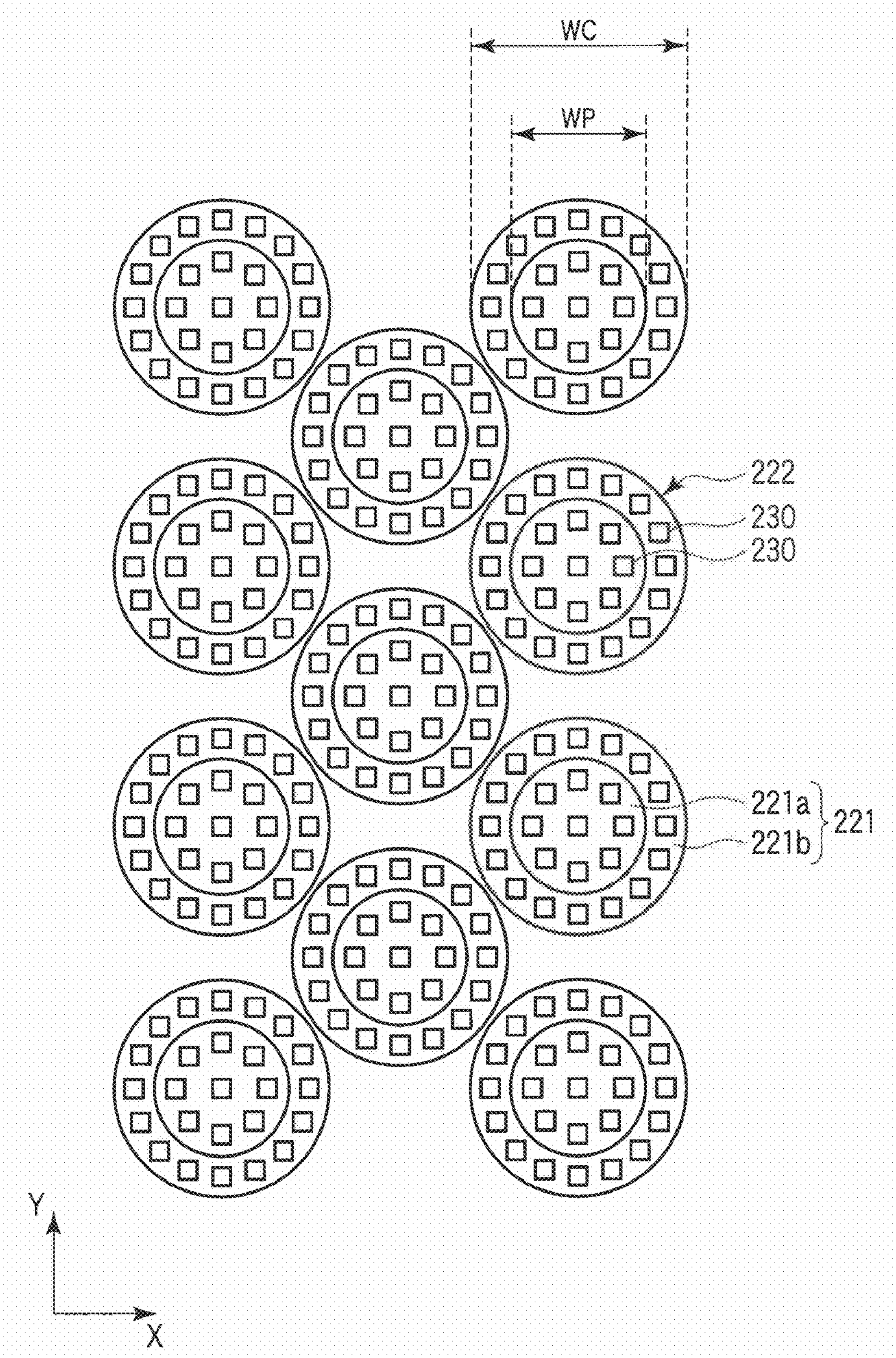
FIG. 30 is a plan view of the vibrator unit in FIG. 29 from above.

FIG. 29 is a perspective view of the vibration element unit 204. FIG. 30 is a plan view of the vibrator unit 204 from above. As shown in FIGS. 29 and 30, the vibrator unit 204 has a base 220 formed of a material usable in a semiconductor process, such as a quartz substrate or a silicon substrate. A plurality of projections 221 are two-dimensionally discretely arranged on the surface of the base 220. That is, the base 220 has a plurality of projections. The projection 221 has a three-dimensional structure in which a plane 221*a* substantially parallel to an XY plane is at the vertex. The plane 221*a* may be completely flat or may be slightly distorted. A curved surface 221*b* is provided to enclose the edge of the plane 221*a*. The curved surface 221*b* is formed obliquely with respect to the plane 221*a*, and connects the plane 221*a* with the surface of the base 220. In other words, the projection 221 has such a three-dimensional structure as a cone the end of which has been removed, as shown in FIG. 29. That is, the projection 221 is circular on the XY plane. The projections 221 are elevated in the Z direction perpendicular to the plane of the base (XY plane).

A diameter WP of the plane 221*a* is designed at, for example, 150 μm. Further, a diameter WC of the bottom surface the projection 221 is designed at, for example, 300 μm. The interval between the centers of the adjacent projections 221 is preferably constant. However, the interval between the centers of the adjacent projections 221 does not necessarily have to be constant.

The plurality of vibration elements 222 are arranged in the plurality of projections 221 by a semiconductor process respectively. Here, the vibration element 222 arranged in the projection 221 having such a three-dimensional structure as a cone the end of which has been removed is called a semi-conical vibration element 222. The semi-conical vibration element 222 has a plurality of MUT elements 230 arranged in the plane 221*a* and the curved surface 221*b*. The signal line 216 is connected to each of the MUT elements 230. The signal lines 216 are bundled into one for each of the semi-conical vibration element 222 in the base 220. That is, one semi-conical vibration element 222 constitutes one channel. More specifically, the plurality of MUT elements 230 arranged in each of the semi-conical vibration element 222 combine to constitute one channel. Each of the MUT elements 230 transmits and receives ultrasonic waves. The ultrasonic radiation surface of the semi-conical vibration element 222 is curved along the surface of the projection 221. The structure of the MUT elements 230 is similar to the structure of the MUT elements 30 according to the first embodiment.

Each of the MUT elements 230 vibrates in a direction perpendicular to the plane or the curved surface in response to the drive signal from an ultrasonic diagnostic apparatus main unit 110 (more specifically, the transmission/reception circuit 114). Therefore, the semi-conical vibration element 222 has the plurality of MUT elements 230 different from each other in vibrating direction in the three-dimensional direction. The plurality of MUT elements 230 arranged in the semi-conical vibration element 222 simultaneously receive a drive signal from the ultrasonic diagnostic apparatus main unit 110 (more specifically, the transmission/reception circuit 114), so that the semi-conical vibration element 222 can radiate ultrasonic waves closer to spherical waves. The drive signal supplied to each of the semi-conical vibration element 222 is delay-controlled to form a three-dimensionally sharp ultrasonic beam.

In addition, the projection 221 is not limited to such a three-dimensional structure as a cone the end of which has been removed. For example, the projection may have such a semispherical structure as a sphere half of which has been removed. A vibration element formed in the projection having a semispherical structure is hereinafter called a semispherical vibration element.

Figure 31:
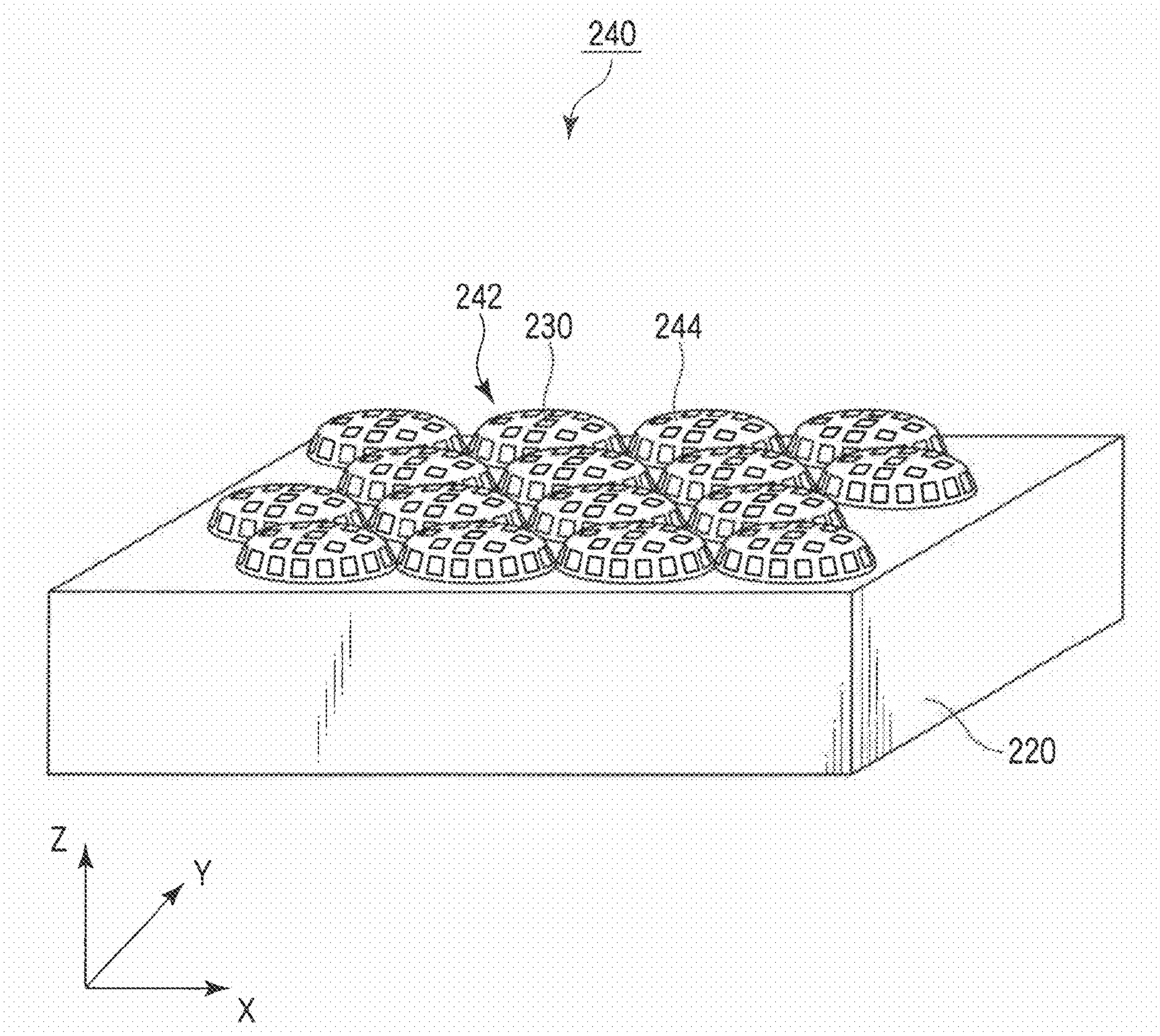
FIG. 31 is a perspective view of an alternative to the vibrator unit in FIG. 28.
Figure 32:
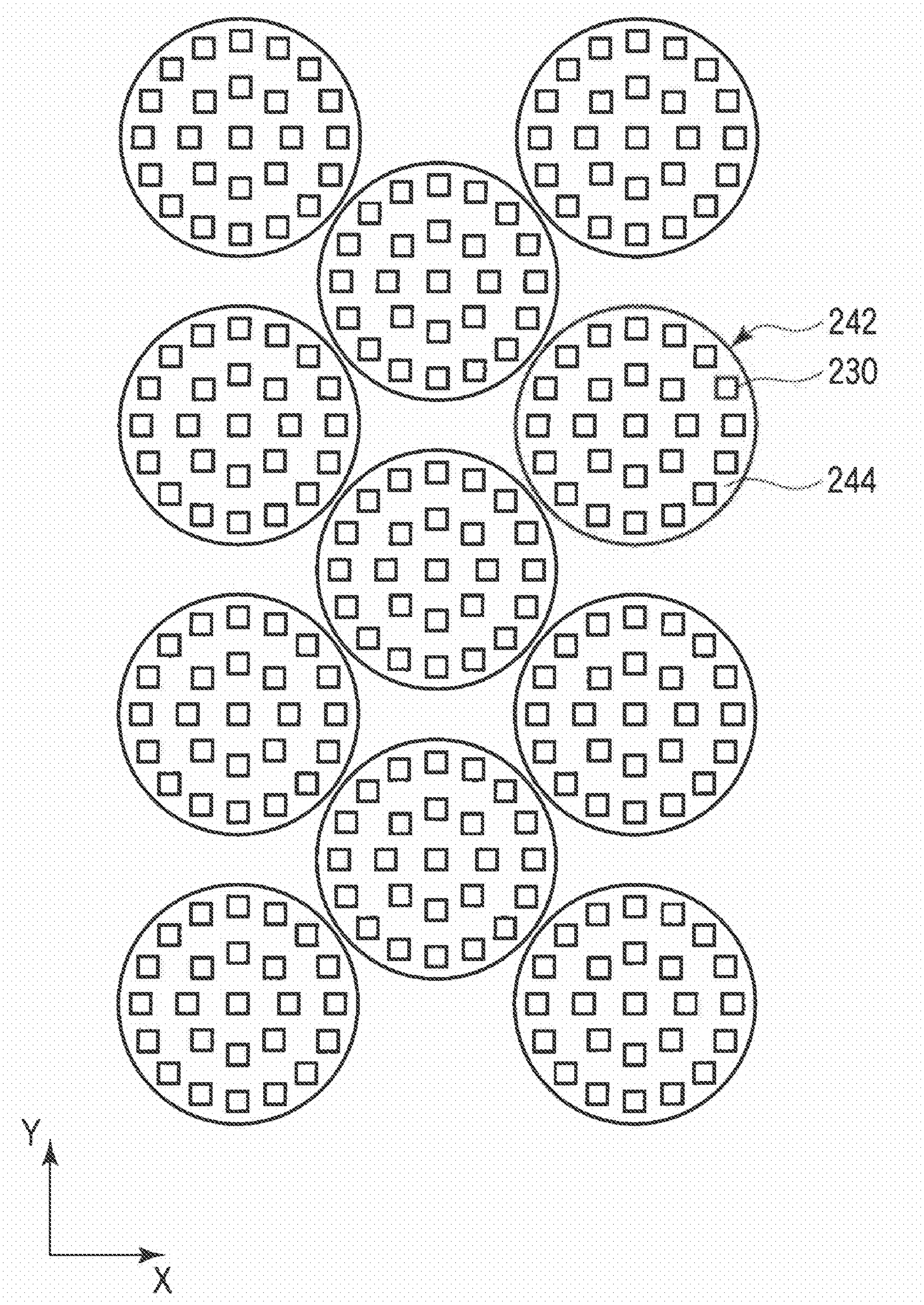
FIG. 32 is a plan view of the vibrator unit in FIG. 31 from above.

FIG. 31 is a perspective view of a vibration element unit 240 having semispherical vibration elements 242. FIG. 32 is a plan view of the vibrator unit 240 from above. A plurality of projections 244 are two-dimensionally discretely arranged on the surface of the base 220. The projection 244 has such a three-dimensional structure as a sphere half of which has been removed. That is, the projection 244 has one semispherical surface (semispherical surface) elevated in a Z axis direction. The semispherical vibration element 242 has the plurality of MUT elements 230 arranged in the projection 244. Typically, one of the plurality of MUT elements 230 is arranged at the top of the projection 244.

The angle of aperture of the projection 244 is designed at, for example, 60 degrees. The radius of a sphere inscribed in the semispherical surface is designed at, for example, 250 μm.

In addition, the projection 244 does not have to be a complete half of a sphere, and may be in the shape of a partly removed sphere. Moreover, the projection 244 does not have to be a mathematically strict sphere, and may be in the shape of a distorted sphere.

Furthermore, the shape of the projections 221 and 244 according to the second embodiment is not limited to the circular shape with respect to the XY plane. For example, the projection may be polygonal with respect to the XY plane. While any polygonal shape equal to or more than a triangular shape can be used for the projection in the second embodiment, a hexagon or octagon is preferred in particular. A vibration element formed in a projection which is hexagonal with respect to the XY plane is hereinafter called a hexagonal vibration element.

Figure 33:
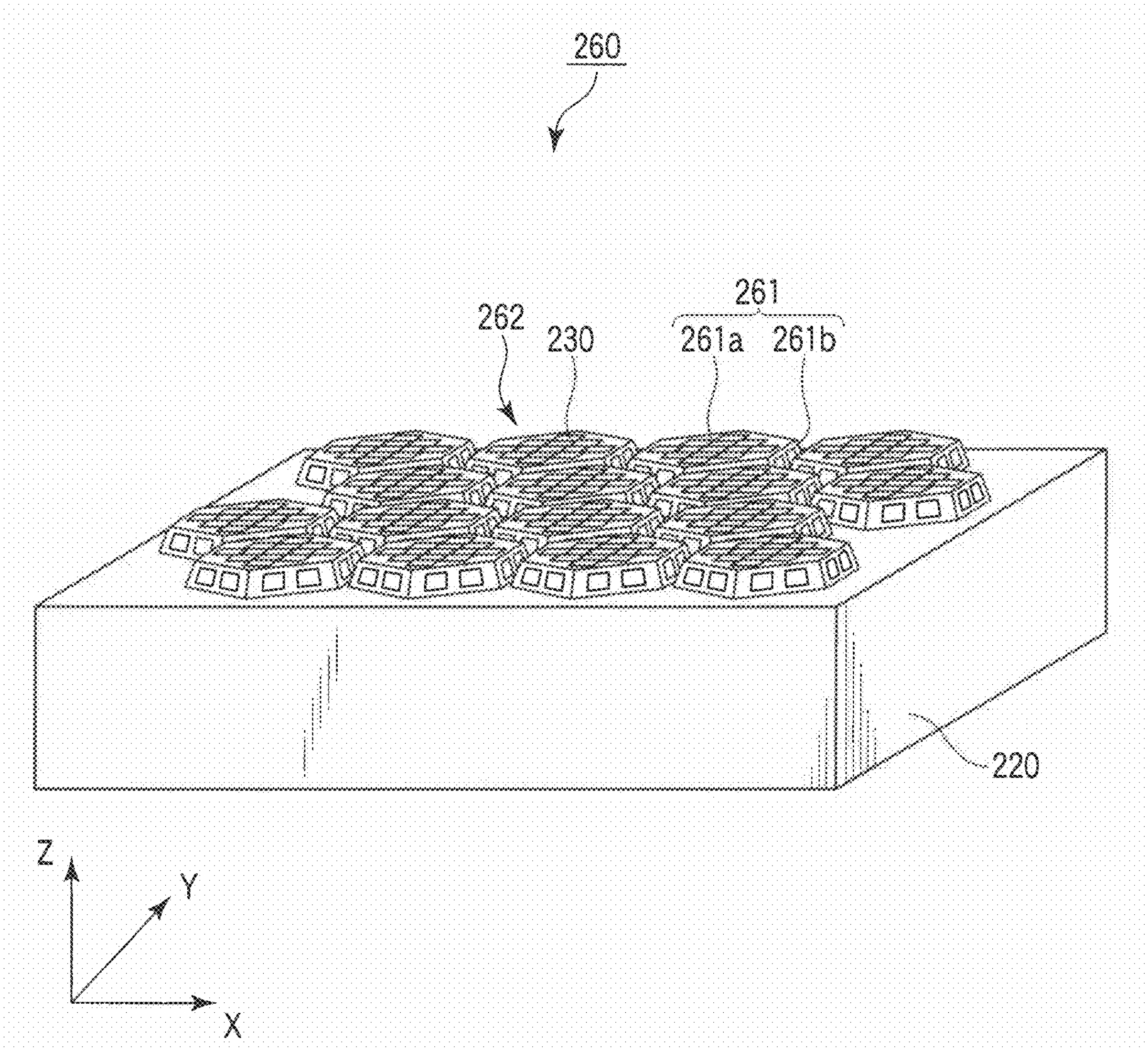
FIG. 33 is a perspective view of another alternative to the vibrator unit in FIG. 28.
Figure 34:
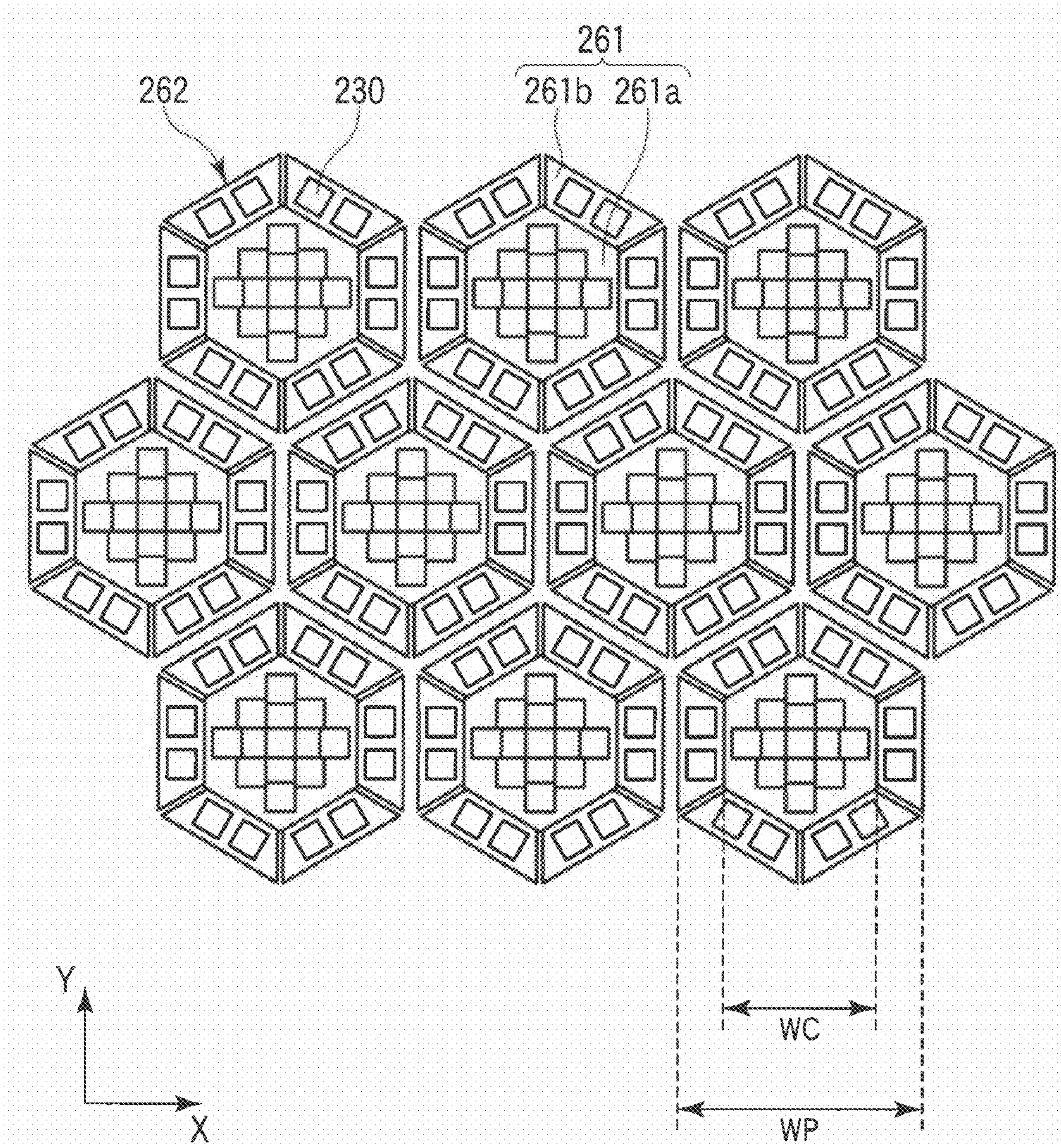
FIG. 34 is a plan view of the vibrator unit in FIG. 33 from above.

FIG. 33 is a perspective view of a vibration element unit 260 having hexagonal vibration elements 262. FIG. 34 is a plan view of the vibrator unit 260 from above. A plurality of projections 261 which are hexagonal with respect to the XY plane are two-dimensionally discretely arranged on the surface of the base 220. The projection 261 has a three-dimensional structure in which a plane 261*a* substantially parallel to the XY plane is at the vertex. The plane 261*a* is hexagonal with respect to the XY plane. A side surface 261*b* is provided on each of six sides of the plane 261*a*. The six side surfaces 261*b* are flat. Each of the six side surfaces 261*b* is formed obliquely with respect to the plane 261*a*, and is connected with the surface of the base 220. That is, the projection 261 has such a three-dimensional structure as a six-sided pyramid the end of which has been removed, as shown in FIG. 33. The hexagonal vibration element 262 has a plurality of MUT elements 230 arranged in the plane 261*a* and the six side surfaces 261*b*.

A method of manufacturing the semi-conical vibration element 222, the semispherical vibration element 242 and the hexagonal vibration element 262 is substantially similar to the three-dimensional extension of the manufacturing method described in the first embodiment. Therefore, the method of manufacturing the semi-conical vibration element 222, the semispherical vibration element 242 and the hexagonal vibration element 262 is not described. Moreover, the characteristics of ultrasonic waves radiated from the semi-conical vibration element 222, the semispherical vibration element 242 and the hexagonal vibration element 262 are substantially similar to the three-dimensional extension of the ultrasonic characteristics described in the first embodiment. Therefore, the characteristics of ultrasonic waves radiated from the semi-conical vibration element 222, the semispherical vibration element 242 and the hexagonal vibration element 262 are not described.

In such a configuration, the semi-conical vibration element 222, the semispherical vibration element 242 and the hexagonal vibration element 262 are arranged in the plurality of two-dimensionally discretely arranged projections 221, projections 244 and projections 261, respectively. Thus, the ultrasonic radiation surfaces of the semi-conical vibration element 222, the semispherical vibration element 242 and the hexagonal vibration element 262 are three-dimensionally convex. As a result, the individual semi-conical vibration elements 222, the semispherical vibration elements 242 and the hexagonal vibration elements 262 can radiate ultrasonic waves three-dimensionally close to spherical waves on a high frequency band as compared with the conventional vibration elements with the flat ultrasonic radiation surfaces. Consequently, according to the second embodiment, it is possible to provide an ultrasonic probe and an ultrasonic diagnostic apparatus capable of maintaining directivity over a wide range without forcing a small width of the vibration elements.

In addition, the base 220 has the plurality of projections 221, projections 244 and projections 261 in the second embodiment. However, the second embodiment is not exclusively limited to this. For example, the base 220 may have a plurality of recesses. The recesses are circular or polygonal with respect to the XY plane. A plurality of vibration elements are arranged in the plurality of respective recesses respectively. Moreover, the plurality of MUT elements 230 are arranged in each of the recesses.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An ultrasonic probe, comprising:

a base having a plurality of projections or recesses; and a plurality of micromachining ultrasound transducer (MUT) elements arranged in each of the projections or recesses, wherein each of the projections or recesses has a plurality of planes or a curved surface, and one of the planes is substantially perpendicular to a thickness direction of the base, or the curved surface is curved in the thickness direction.

2. The ultrasonic probe according to claim 1, wherein the plurality of projections are arrayed on the base along a first direction, which is substantially perpendicular to the thickness direction, and are arranged in parallel to a second direction perpendicular to both the thickness direction and the first direction.

3. The ultrasonic probe according to claim 2, wherein a plurality of vibration elements are arranged in the plurality of projections respectively, each of the vibration elements includes a plurality of MUT arrays arranged in the projection along the first direction, and each of the MUT arrays includes a plurality of the MUT elements arrayed in the projection along the second direction.

4. The ultrasonic probe according to claim 3, wherein each of the projections has three planes, one of the three planes is substantially perpendicular to the thickness direction, and three or more MUT arrays are arranged in the three planes.

5. The ultrasonic probe according to claim 3, wherein each of the projections has one surface curved in the thickness direction, and three MUT arrays are arranged in the one curved surface.

6. The ultrasonic probe according to claim 1, wherein the plurality of projections are two-dimensionally discretely arrayed on the base along a first direction substantially perpendicular to the thickness direction and a second direction substantially perpendicular to both the thickness direction and the first direction.

7. The ultrasonic probe according to claim 6, wherein a plurality of vibration elements are arranged in the plurality of projections respectively, and each of the vibration elements has a plurality of the MUT elements arranged in the first and second directions.

8. The ultrasonic probe according to claim 7, wherein each of the projections has six or eight planes, one of the six or eight planes is substantially perpendicular to the thickness direction, and the plurality of MUT elements are arranged in the six or eight planes.

9. The ultrasonic probe according to claim 7, wherein each of the plurality of projections has one plane and one curved surface, the one plane is substantially perpendicular to the thickness direction, and a plurality of the MUT elements are arranged in the one plane and the one curved surface.

10. The ultrasonic probe according to claim 7, wherein each of the projections has one semispherical surface, the semispherical surface is elevated in the thickness direction, and the plurality of MUT elements is arranged in the semispherical surface.

11. An ultrasonic probe, comprising:
a base having a plurality of projections or recesses arrayed along at least one direction; and
a plurality of vibration elements arranged in the plurality of projections or recesses respectively, each of the vibration elements having ultrasonic radiation surfaces curved along surfaces of each of the projections or recesses.

12. The ultrasonic probe according to claim 11, wherein each of the vibration elements has a plurality of micromachining ultrasound transducer (MUT) elements, and the plurality of MUT elements is arranged in each of the projections or recesses.

13. The ultrasonic probe according to claim 11, wherein each of the vibration elements constitutes one channel.

14. An ultrasonic diagnostic apparatus, comprising:
an ultrasonic probe according to claim 1;
a signal processing unit that subjects an echo signal from the ultrasonic probe to image processing to generate image data; and
a display unit that displays the generated image data.

15. An ultrasonic probe, comprising:
a base including a plurality of projections; and
a plurality of vibration elements arranged in the projections, respectively, wherein
the projections are two-dimensionally discretely arrayed on the base along a first direction and a second direction substantially perpendicular to the first direction,
each of the projections includes one semispherical surface elevated in a third direction substantially perpendicular to the first and second directions, and
each of the vibration elements includes a plurality of micromachining ultrasound transducers (MUT) elements arrayed on the semispherical surface along the first direction and the second direction.

* * * * *